(12) United States Patent
Harikai et al.

(10) Patent No.: US 11,361,944 B2
(45) Date of Patent: Jun. 14, 2022

(54) PLASMA PROCESSING METHOD, AND ELEMENT CHIP MANUFACTURING METHOD

(71) Applicant: Panasonic Intellectual Property Management Co., Ltd., Osaka (JP)

(72) Inventors: Atsushi Harikai, Osaka (JP); Shogo Okita, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 17/114,679

(22) Filed: Dec. 8, 2020

(65) Prior Publication Data
US 2021/0202207 A1    Jul. 1, 2021

(30) Foreign Application Priority Data

Dec. 27, 2019 (JP) .............................. JP2019-239421

(51) Int. Cl.
| H01L 21/311 | (2006.01) |
| H01L 21/02 | (2006.01) |
| H01L 21/3065 | (2006.01) |
| H01J 37/32 | (2006.01) |
| H01J 37/18 | (2006.01) |

(52) U.S. Cl.
CPC .......... *H01J 37/3244* (2013.01); *H01J 37/18* (2013.01); *H01L 21/02164* (2013.01); *H01L 21/3065* (2013.01); *H01L 21/31116* (2013.01); *H01J 2237/334* (2013.01); *H01J 2237/335* (2013.01)

(58) Field of Classification Search
None
See application file for complete search history.

(56) References Cited

U.S. PATENT DOCUMENTS

| 5,501,893 A * | 3/1996 | Laermer ............. H01L 21/3065 216/67 |
| 6,071,822 A * | 6/2000 | Donohue ............ B81C 1/00571 438/712 |
| 2001/0020516 A1* | 9/2001 | Khan ................. H01L 21/67069 156/345.24 |
| 2016/0027546 A1* | 1/2016 | Teshima ................. A61B 6/484 378/154 |
| 2017/0117118 A1* | 4/2017 | Toh ................... H01J 37/32715 |
| 2018/0261464 A1* | 9/2018 | Kobayashi ........ H01L 29/66795 |

FOREIGN PATENT DOCUMENTS

JP   2002-190538 A    7/2002

\* cited by examiner

*Primary Examiner* — Shamim Ahmed
(74) *Attorney, Agent, or Firm* — Pearne & Gordon LLP

(57) ABSTRACT

A plasma processing method, including: a trenched substrate preparation process of preparing a trenched substrate having trenches having a bottom exposing an oxide film; and an oxide film removal process of exposing the trenched substrate to a plasma, to remove the oxide film. The oxide film removal process includes a plurality of cycles, each cycle including: an oxide film etching step of etching the oxide film; and a cleaning step of removing an attached matter on inner walls of the trenches, after the oxide film etching step.

7 Claims, 20 Drawing Sheets

PLASMA PROCESSING METHOD, AND ELEMENT CHIP MANUFACTURING METHOD

CROSS REFERENCE TO RELATED APPLICATION

The present application is based on and claims priority under 35 U.S.C. § 119 with respect to the Japanese Patent Application No. 2019-239421 filed on Dec. 27, 2019, of which entire content is incorporated herein by reference into the present application.

TECHNICAL FIELD

The present invention relates to a plasma processing method, and an element chip manufacturing method.

BACKGROUND

Some substrates have a silicon oxide film with electrically insulating properties formed on their surfaces. The oxide film serves as, for example, a MOS gate film, an interlayer insulating film, or a protective film. Patent Literature 1 (JP 2002-190538) discloses a method of dicing a substrate including a silicon oxide film, by etching with plasma.

According to the method of Patent Literature 1, etching can be performed such that the sidewalls of the silicon oxide film have a tapered profile. In some cases, however, plasma-etching is difficult to vertically etch a substrate having a silicon oxide film. Especially when the silicon oxide film is laminated on the backside of the substrate, in order to etch the silicon oxide film subsequently to the substrate, it is necessary to control the quantity and the angle of the ions or radicals that reach the trench bottom.

SUMMARY

One aspect of the present invention relates to a plasma processing method, including: a trenched substrate preparation process of preparing a trenched substrate having trenches having a bottom exposing an oxide film; and an oxide film removal process of exposing the trenched substrate to a plasma, to remove the oxide film, the oxide film removal process including a plurality of cycles, each cycle including: an oxide film etching step of etching the oxide film; and a cleaning step of removing an attached matter on inner walls of the trenches, after the oxide film etching step.

Another aspect of the present invention relates to an element chip manufacturing method, including: a laminate substrate preparation process of preparing a laminate substrate having a first principal surface and a second principal surface opposite to the first principal surface, the laminate substrate including a silicon layer containing silicon and an oxide film disposed on the silicon layer on the second principal surface side, the laminate substrate being segmented into a plurality of element regions and a plurality of dicing regions; a silicon layer removal process of exposing the laminate substrate to a plasma, to remove the silicon layer along the dicing regions until the oxide film is exposed on the first principal surface side, to form trenches; and an oxide film removal process of exposing the trenches to a plasma, after the silicon layer removal process, to remove the oxide film exposed at a bottom of the trenches, the oxide film removal process including a plurality of cycles, each cycle including: an oxide film etching step of etching the oxide film; and a cleaning step of removing an attached matter on inner walls of the trenches, after the oxide film etching step.

According to the present invention, the oxide film can be processed vertically by plasma processing.

DETAILED DESCRIPTION

Plasma-etching of an oxide film containing silicon dioxide or the like usually uses a gas containing carbon atoms (hereinafter, carbon-containing gas). When a trenched substrate having a plurality of trenches for dicing is exposed to a carbon-containing gas, etching proceeds on the bottom of the trenches, whereas a matter derived from the carbon-containing gas attaches and builds up on the sidewalls of the trenches. The deeper the trenches are, the more likely the attached matter is to build up. Ions or radicals having etching ability are thus blocked by the attached matter on the sidewalls of the trenches, and become difficult to reach the bottom of the trenches. As a result, the oxide film is etched in a tapered shape whose diameter gradually decreases toward the end, which degrades the quality. Moreover, when a layer to be further subjected to plasma-etching is present below the oxide film, the low verticality of the side surface of the oxide film may be a cause of reduction in the accuracy of the plasma-etching of the underlying layer. Furthermore, when the side surfaces of the divided oxide films have a tapered shape whose diameter gradually decreases toward the end, the etching is in some cases difficult to proceed to a desired depth.

In the present embodiment, an etching step using a carbon-containing gas and a cleaning step of removing an attached matter on the inner walls, especially on the sidewalls, of the trenches are repeatedly performed. This can improve the verticality of the side surfaces of the divided oxide films, making it possible to provide high-quality element chips. In addition, this can make the width of the dicing trenches narrow, which can reduce the substrate loss. Here, that the verticality of the side surfaces of the divided oxide films is high means that one of the principal surfaces of the resulting element chip and the side surface of the oxide film form an angle of 90±5 degrees.

The plasma processing method according to the present embodiment is particularly suitable as one of the processes for manufacturing element chips from a laminate substrate including a silicon layer and an oxide film. The present embodiment encompasses an element chip manufacturing method using the plasma processing method.

A. Plasma Processing Method

Figure 1:
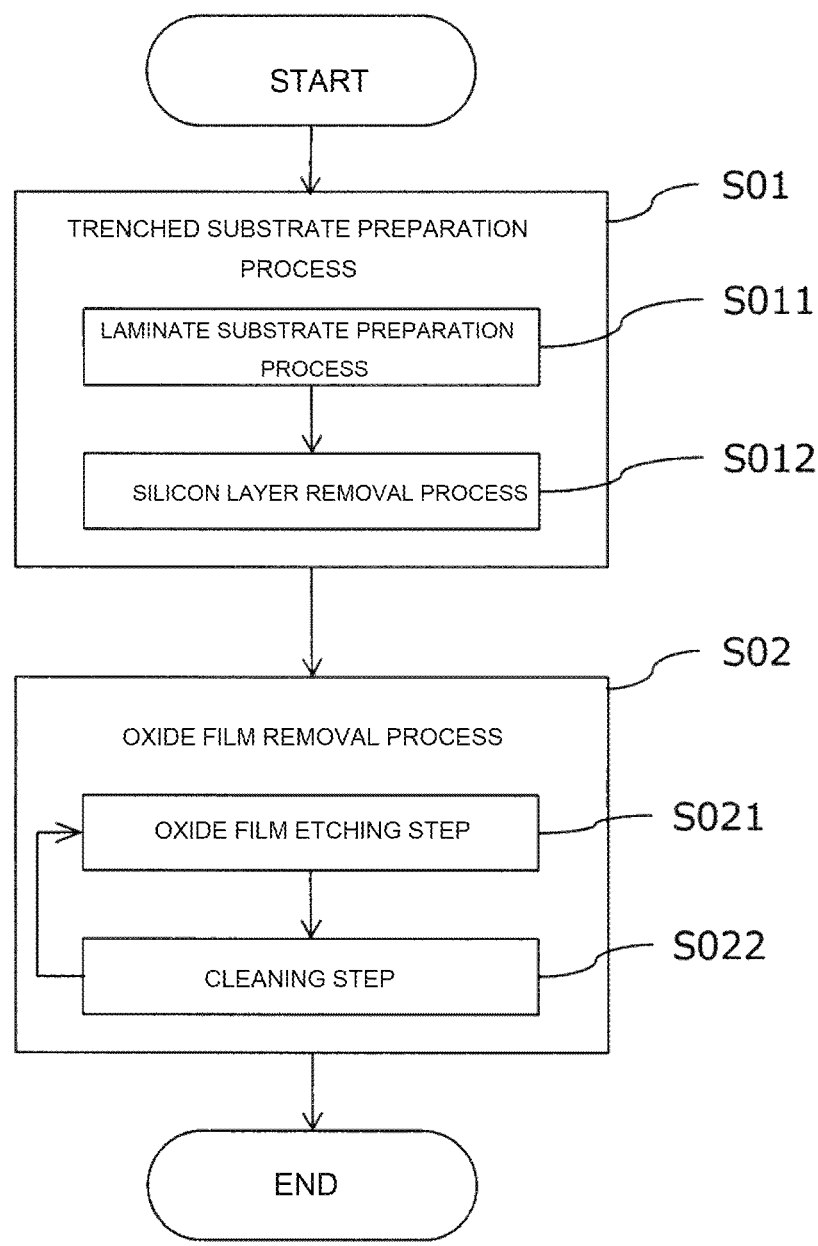
FIG. 1 is a flowchart of a plasma processing method according to an embodiment of the present invention.

The plasma processing method according to the present embodiment includes: a trenched substrate preparation process of preparing a trenched substrate having trenches having a bottom exposing an oxide film; and an oxide film removal process of exposing the trenched substrate to a plasma, to remove the oxide film. The oxide film removal process includes a plurality of cycles, each cycle including: an oxide film etching step of etching the oxide film; and a cleaning step of removing an attached matter on the inner walls of the trenches, after the oxide film etching step. FIG. 1 is a flowchart of the plasma processing method according to the present embodiment.

(i) Trenched Substrate Preparation Process (S01)

A trenched substrate to be subjected to plasma processing is prepared.

The trenched substrate has a plurality of trenches, and an oxide film is exposed at the bottom of the trenches. The plurality of trenches are, for example, used for dicing and singulating the substrate along the trenches. The present embodiment is a method of plasma etching the difficult-to-etch oxide film exposed at the bottom of the trenches. According to the plasma processing method of the present embodiment, the oxide film exposed at the bottom of the trenches with high aspect ratio can be etched at a nearly vertical angle. The trench with high aspect ratio refers to a trench that is sufficiently deeply etched relative to the width of the trench. The ratio of the width to the depth of the trench (width/depth) is, for example, 1/5 or more and 1/20 or less.

The trenched substrate as above can be obtained, for example, from a laminate substrate including an oxide film and a silicon layer containing silicon, by partially removing the silicon layer until the oxide film is exposed, to form trenches. For example, the trenched substrate is prepared by a method including: a laminate substrate preparation process (S011) of preparing a laminate substrate having a first principal surface and a second principal surface opposite to the first principal surface, the laminate substrate including a silicon layer containing silicon and an oxide film disposed on the silicon layer on the second principal surface side, the laminate substrate being segmented into a plurality of element regions and a plurality of dicing regions; and a silicon layer removal process (S012) of removing the silicon layer along the dicing regions, until the oxide film is exposed on the first principal surface side, to form trenches.

(a) Laminate Substrate Preparation Process

The laminate substrate has a first principal surface and a second principal surface and is segmented into a plurality of element regions and a plurality of dicing regions. The laminate substrate includes a silicon layer containing silicon (first silicon layer) and an oxide film disposed on the first silicon layer on the second principal surface side. On the first silicon layer in the element regions on the first principal surface side, a wiring layer may be disposed. On the first silicon layer in the dicing regions on the first principal surface side, an electrically insulating film and a metal material, such as TEG (Test Element Group), may be disposed. Etching the laminate substrate along the dicing regions can provide a plurality of element chips.

The laminate substrate may be of any size, and is, for example, about 3 in. or more and 12 in. or less in diameter. The laminate substrate may be of any shape, and is, for example, circular or rectangular. The laminate substrate may be provided with a cut, such as an orientation flat or a notch.

The first silicon layer contains silicon (Si). The first silicon layer may have any thickness; the thickness may be, for example, 20 μm or more and 1000 μm or less, and 100 μm or more and 300 μm or less.

The oxide film is may be any oxide film that has electrically insulating properties, and contains, for example, silicon dioxide ($SiO_2$), or silicon oxynitride (SiON). The oxide film may have any thickness, which is set as appropriate depending on the application and the like. The thickness of the oxide film is, for example, 1 μm or more and 50 μm or less.

The wiring layer constitutes, for example, a semiconductor circuit, an electronic component element (e.g., LED, laser, MEMS), and may include an electrically insulating film, a metal material, a resin layer (e.g., polyimide), a resist layer, an electrode pad, a bump, and others. The insulating film may be in the form of a laminate with a wiring metal material (e.g., multilevel wiring layer, redistribution layer).

The laminate substrate may include a plurality of silicon layers. For example, the laminate substrate may include a first silicon layer, an oxide film, and a second silicon layer disposed on the oxide film on the second principal surface side. The second silicon layer may have a similar configuration to that of the first silicon layer.

The dicing regions define the element regions. The shape of the dicing regions may be set as appropriate according to a desired shape of element chips, without limited to a straight linear shape, and may be, for example, a zig-zag shape or a wavy line shape. Note that the shape of element chips is, for example, rectangular or hexagonal.

The width of the dicing regions may be set as appropriate depending on the size of the substrate or the element chips, and others. The width of the dicing regions is, for example, 10 µm or more and 300 µm or less. A plurality of the dicing regions may have the same width or different widths. The dicing region is typically formed in plural numbers on the substrate. The pitch between the dicing regions adjacent to each other also is not limited, and may be set as appropriate depending on the size of the substrate or the element chips, and others.

(b) Silicon Layer Removal Process (S012)

The first silicon layer is removed along the dicing regions, until the oxide film is exposed on the first principal surface side, to form trenches.

The silicon layer removal process can be performed by a Bosch process using a plasma.

The Bosch process is a technique that repeats a cycle multiple times to achieve a deep etching, the cycle including a silicon etching step of plasma-etching the first silicon layer along the dicing regions; and a protective film deposition step of exposing trenches formed by the etching step to a plasma, to deposit a film (protective film) on the inner walls of the trenches. According to this technique, trenches with high aspect ratio can be formed. The Bosch process includes a step of removing the protective film in the second and subsequent cycles, the step performed between the etching step and the protective film deposition step.

Figure 2:
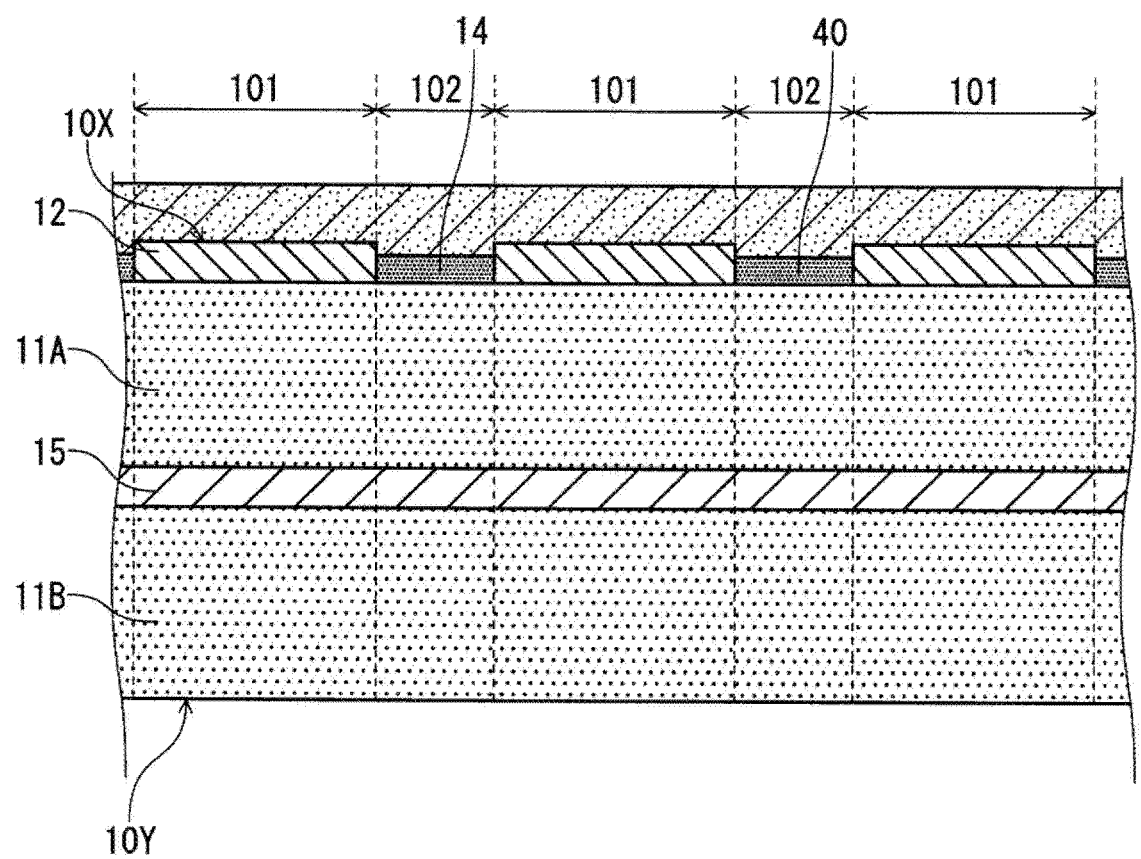
FIG. 2 is a schematic partial cross-sectional view of a laminate substrate according to an embodiment of the present invention.

FIG. 2 is a schematic partial cross-sectional view of the laminate substrate prepared. according to an embodiment of the present invention. A laminate substrate 10A includes a first silicon layer 11A, an oxide film 15, and a second silicon layer 11B disposed on the oxide film 15 on a second principal surface 10Y side. The laminate substrate 10A is segmented into a plurality of element regions 101 and a plurality of dicing regions 102. On the first silicon layer 11A in the element regions 101 on a first principal surface 10X side, a wiring layer 12 is disposed. On the first silicon layer 11A in the dicing regions 102 on the first principal surface 10X side, an electrically insulating film 14 is disposed. The surfaces of the wiring layers 12 and the insulating films 14 are covered with a resin film 40.

Figure 3:
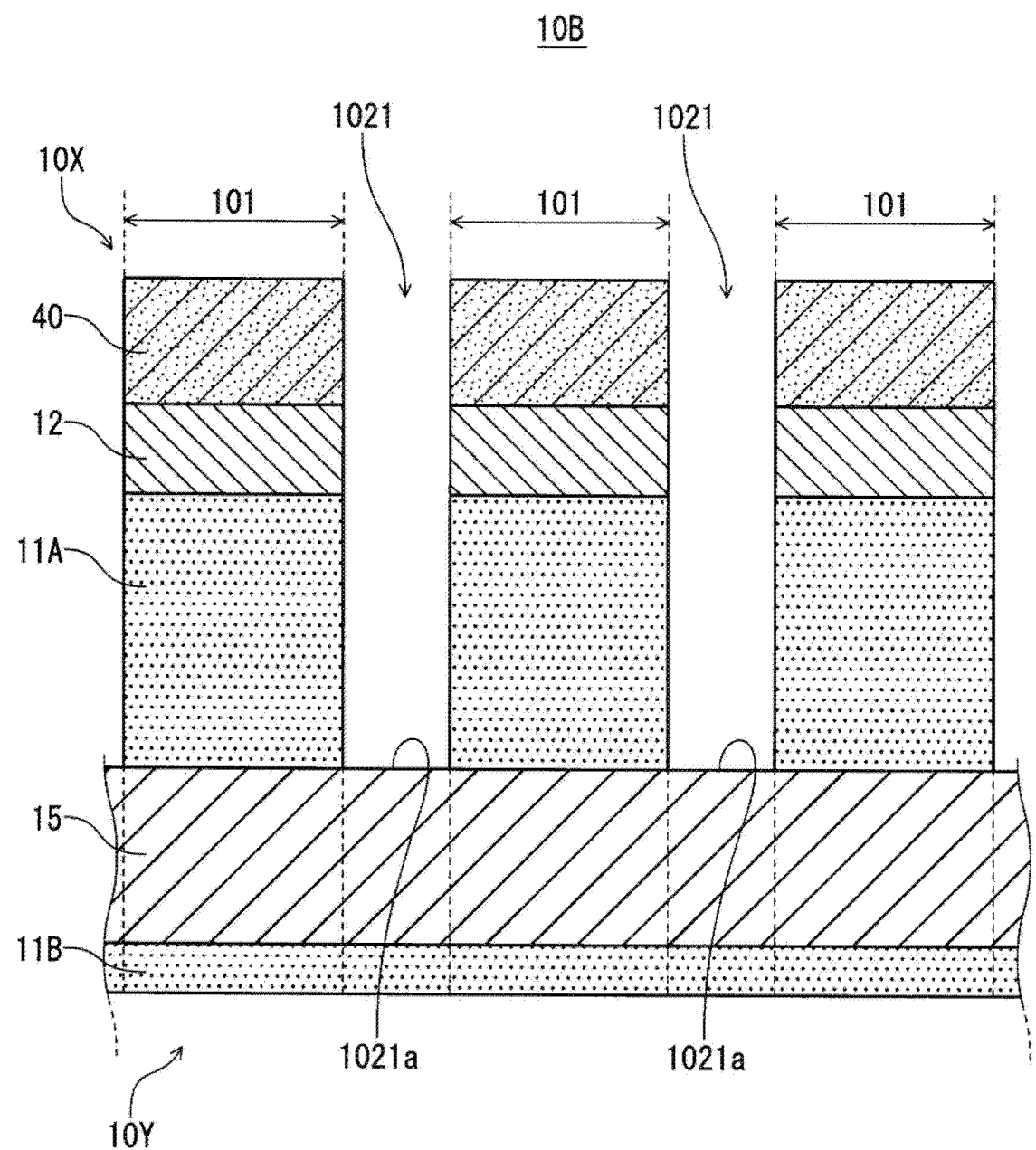
FIG. 3 is a schematic cross-sectional view showing an essential part of a trenched substrate according to an embodiment of the present invention.

FIG. 3 is a schematic cross-sectional view showing an essential part of the trenched substrate prepared. In a trenched substrate 10B, the resin film 40, the insulating film 14 and the first silicon layer 11A are removed along the divided regions 102, and a plurality of trenches 1021 are formed. The oxide film 15 is exposed at a bottom 1021a of the trenches 1021.

(ii) Oxide Film Removal Process (S02)

The oxide film is exposed to a plasma and etched.

In the oxide film removal process, a cycle including an oxide film etching step (S021) of etching the oxide film, and a cleaning step (S022) of removing an attached matter on the inner walls of the trenches, after the oxide film etching step are repeated a plurality of times.

(a) Oxide Film Etching Step (S021)

In the oxide etching step, anisotropic etching is performed, so that the oxide film exposed at the bottom of the trenches is etched.

The oxide film etching step uses, for example, a first plasma generated from an etching gas containing a gas containing carbon atoms (carbon-containing gas). Examples of the carbon-containing gas include a fluorocarbon, such as $CF_4$ or $C_4F_8$, and a fluorohydrocarbon, such as $CHF_3$. Preferred is a fluorocarbon because the etching rate tend to be high.

The carbon-containing gas like a fluorocarbon can efficiently etch the oxide film. On the other hand, a reaction product of the reaction between the oxide film and the fluorocarbon tends to attach onto the inner walls of the trenches. The lower the temperature of the substrate is, the more the attached matter increases.

In the Bosch process for etching the silicon layer, it is important to deposit a protective film that is thick enough to protect the inner walls of the trenches, in the protective film deposition step. Therefore, the Bosch process is performed while the laminate substrate is cooled to, for example, about −10° C. This facilitates the formation of a protective film, and allows for maintaining the thickness of a resin film serving to protect the element regions (see the later description).

On the other hand, in the oxide film removal process, a smaller amount of the attached matter on the inner walls of the trenches is desirable. For this reason, the oxide film removal process is performed while the temperature of the trenched substrate is kept higher than that in the Bosch process. This can suppress the buildup of the attached matter as well as can facilitate the removal of the attached matter. Consequently, the cleaning step can be completed in a shorter time. In the oxide film removal process, for example, the temperature of the trenched substrate is kept at 0° C. or higher. However, to avoid the deterioration of the trenched substrate and other inconveniences, the temperature of the trenched substrate in the oxide film removal process is preferably 40° C. or less.

Since the resin film serving to protect the element region is thick as described above, the verticality of the side surfaces of the resulting oxide films in the present step tends to be further improved. Usually, when the resin film lacks sufficient thickness, the trenches formed by plasma etching are likely to have a tapered shape whose diameter gradually decreases toward the end.

The etching gas may further contain $SF_6$, or a rare gas, such as Ar or He, or other gases. Preferred is $SF_6$, because the selection ratio, i.e., the ratio of etching rates, of the oxide film to the other compound (e.g., resin film as described later) tends to be high. However, in view of the etching rate, the ratio of the carbon-containing gas occupying the etching gas may be 3 vol % or more 30 vol % or less, and may be 5 vol % or more 20 vol % or less. In view of the selection ratio, the ratio of $SF_6$ occupying the etching gas may be 3 vol % or more 30 vol % or less, and may be 5 vol % or more 20 vol % or less.

The flow rate of the entire etching gas may be set as appropriate depending on the thickness and the like of the trenched substrate. The flow rate of the entire etching gas may be 5 sccm or more and 500 sccm or less, and may be 50 sccm or more and 400 sccm or less.

The first plasma is generated by supplying an etching gas into a decompressed vacuum chamber, and then applying a high-frequency power to an electrode (first electrode) arranged outside and above the vacuum chamber. The pressure in the vacuum chamber is, for example, 0.1 Pa or more and 30 Pa or less. The high-frequency power applied to the first electrode is, for example, 500 W or more and 4800 W or less. The trenched substrate is placed on a stage in the vacuum chamber. The length of time of exposing the trenched substrate to the first plasma is not limited, and is, for example, 1 min or more and 10 min or less.

At this time, a high-frequency power may be further applied to an electrode incorporated in the stage (second electrode), so that the stage is applied with a bias voltage. This is likely to increase the etching rate. The high-frequency power applied to the second electrode is, for example, 20 W or more and 3000 W or less.

(b) Cleaning Step (S022)

In the cleaning step, isotropic etching is performed, so that the sidewalls of the trenches in particular are etched. As a result, the attached matter on the side walls of the trenches is removed. This allows ions or radicals to easily reach the bottom of the trenches.

The cleaning step uses, for example, a second plasma generated from a cleaning gas containing oxygen gas. The cleaning gas may further contain a rare gas, such as Ar or He, or other gases. In view of the cleaning effect, the ratio of the oxygen gas occupying the cleaning gas may be 50 vol % or more, and may be 90 vol % or more.

The flow rate of the entire cleaning gas is not limited, and is set as appropriate, depending on the thickness and the like of the trenched substrate. The flow rate of the entire cleaning gas may be 5 sccm or more and 500 sccm or less, and may be 50 sccm or more and 400 sccm or less.

The second plasma is generated, similarly to the above, by supplying a cleaning gas to the decompressed vacuum chamber, and then applying a high-frequency power to the first electrode. The pressure in the vacuum chamber is, for example, 0.1 Pa or more and 30 Pa or less. The high-frequency power applied to the first electrode is, for example, 500 W or more and 4800 W or less. The length of time of exposing the trenched substrate to the second plasma is not limited, and is, for example, 30 s or more and 5 min or less.

At this time, a high-frequency power may be further applied to the electrode incorporated in the stage (second electrode), so that the stage is applied with a bias voltage. This is likely to increase the etching rate. The high-frequency power applied to the second electrode is, for example, 0 W or more and 100 W or less.

The oxide film etching step and the cleaning step are alternately repeated a plurality of times. This improves the verticality of the side surfaces of the oxide film. The number of cycles repeated, each cycle including the oxide film etching step and the cleaning step, is set as appropriate depending on the thickness, material, and the like of the oxide film. In the case of removing a film having a thickness of 10 μm and containing silicon dioxide, the number of cycles repeated may be, for example, 10 or more and 100 or less.

Figure 4:
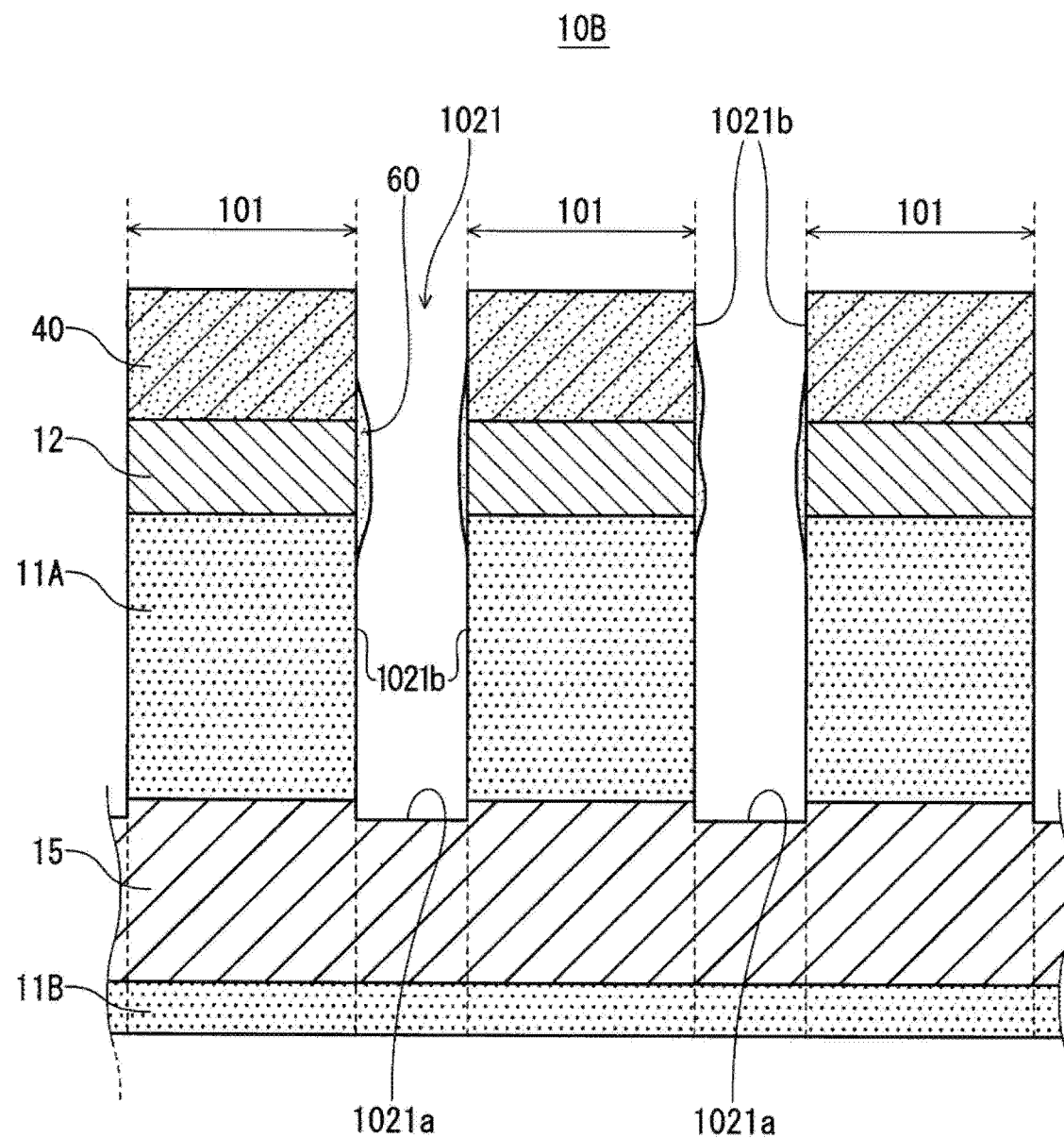
FIG. 4 is a schematic cross-sectional view showing an essential part of the trenched substrate after an oxide film etching step according to an embodiment of the present invention.

FIG. 4 is a schematic cross-sectional view showing an essential part of the trenched substrate after the oxide film etching step at the 1st cycle according to the present embodiment. In the oxide film etching step, the oxide film 15 exposed at the bottom 1021a of the trenches is partially etched. On the other hand, a reaction product of the reaction between the oxide film 15 and the etching gas is built up as an attached matter 60 on the sidewalls 1021b of the trenches.

Figure 5:
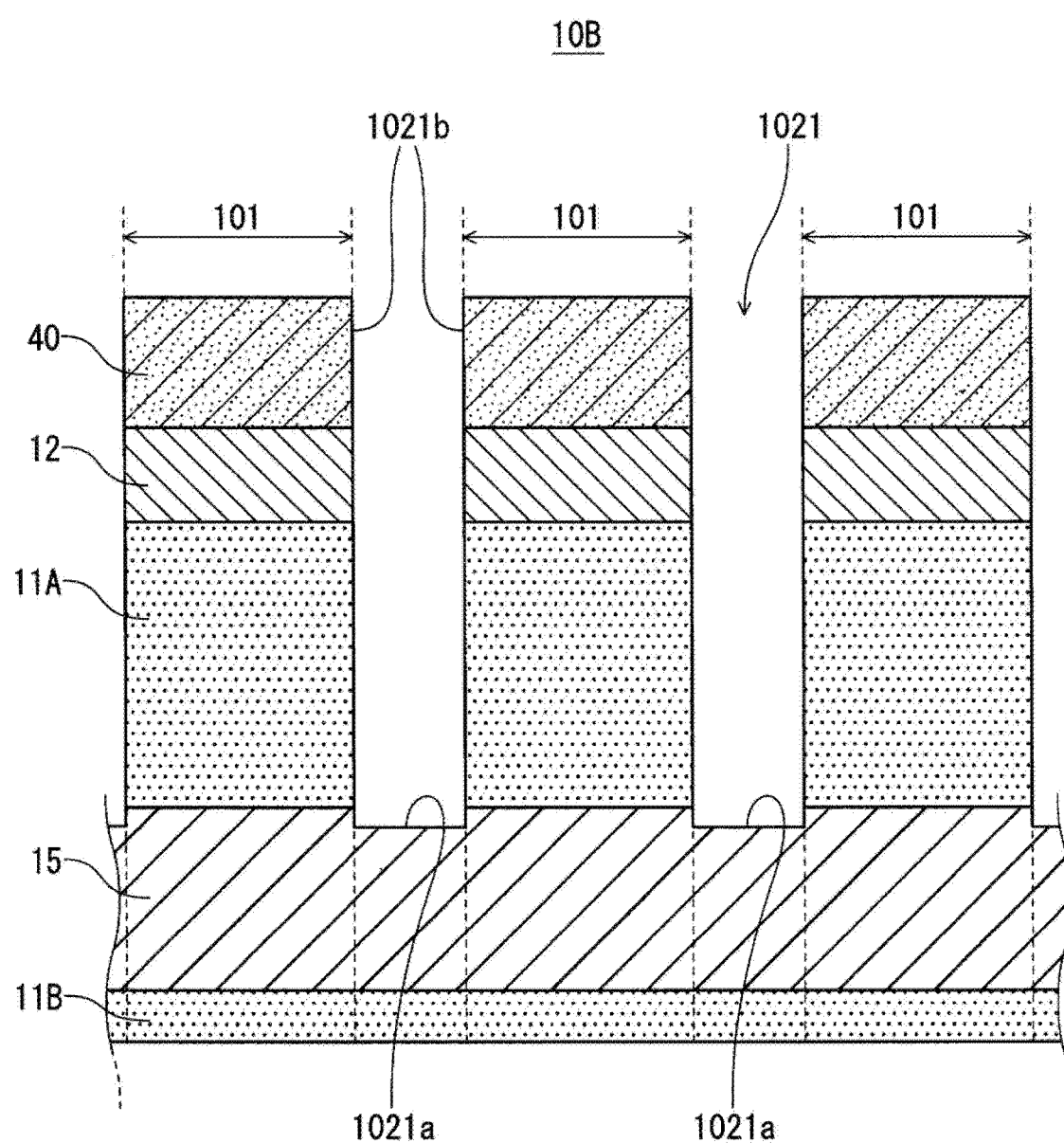
FIG. 5 is a schematic cross-sectional view showing an essential part of the trenched substrate after a cleaning step according to an embodiment of the present invention.

FIG. 5 is a schematic cross-sectional view showing an essential part of the trenched substrate after the cleaning step at the 1st cycle according to the present embodiment. In the cleaning step, the sidewalls 1021b of the trenches are etched, and the attached matter 60 on the sidewalls 1021b is removed.

Figure 6:
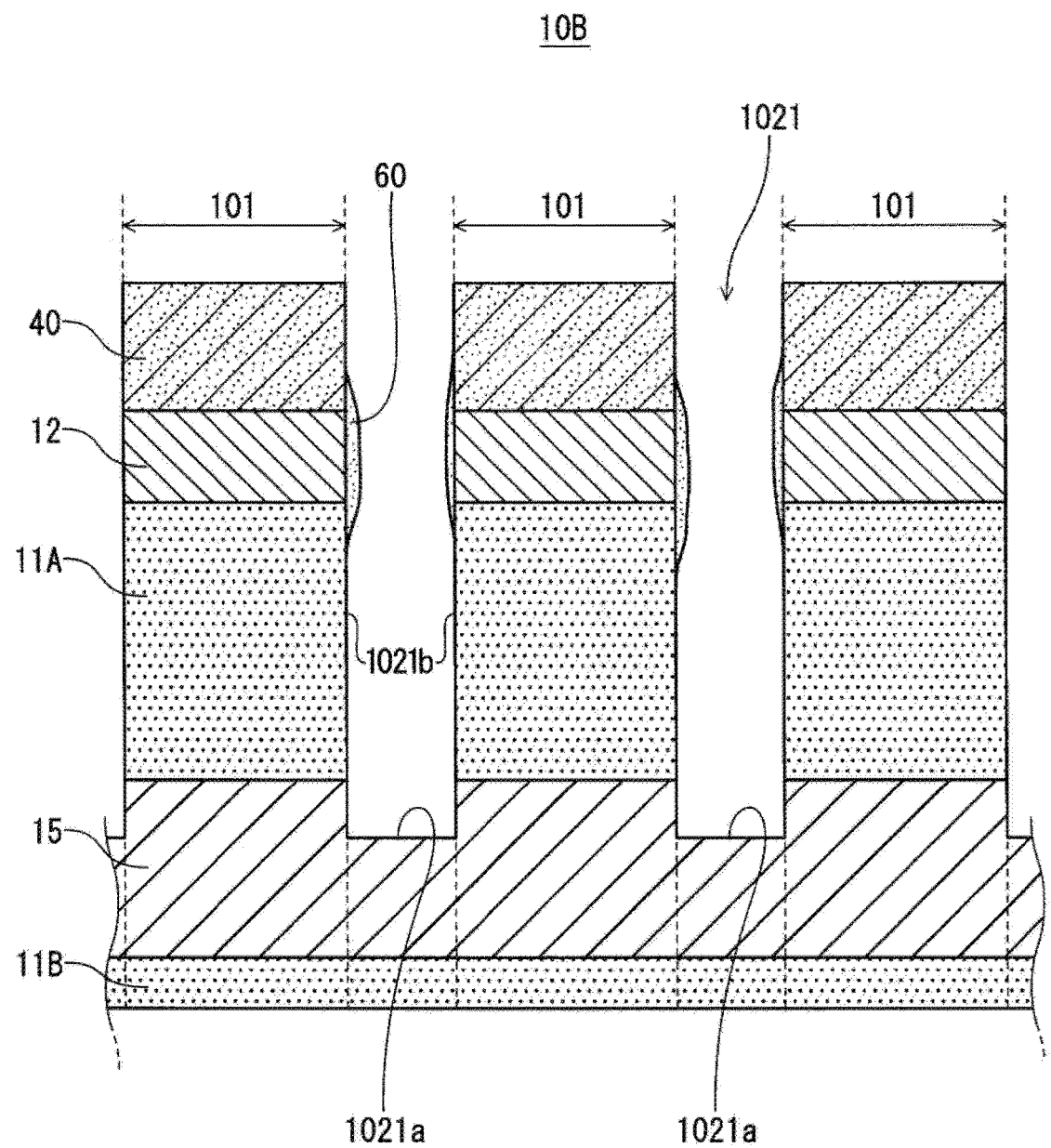
FIG. 6 is a schematic cross-sectional view showing an essential part of the trenched substrate after the oxide film etching step in the 2nd cycle according to an embodiment of the present invention.

FIG. 6 is a schematic cross-sectional view showing an essential part of the trenched substrate after the oxide film etching step in the 2nd cycle according to the present embodiment. The oxide film 15 exposed at the bottom 1021a of the trenches is further etched, but on the other hand, the attached matter 60 is built up again on the sidewalls 1021b.

Figure 7:
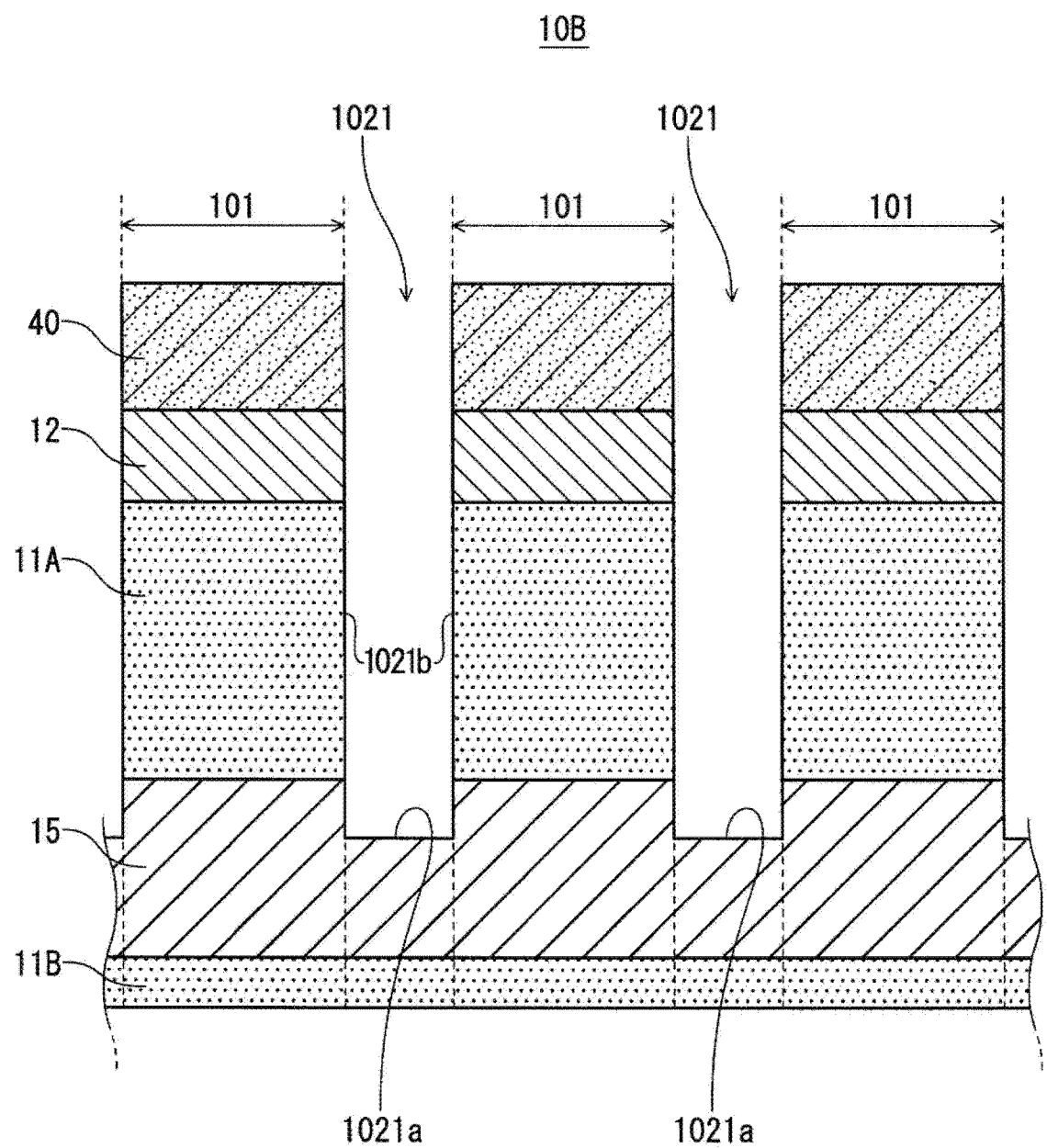
FIG. 7 is a schematic cross-sectional view showing an essential part of the trenched substrate after the cleaning step in the 2nd cycle according to an embodiment of the present invention.

FIG. 7 is a schematic cross-sectional view showing an essential part of the trenched substrate after the cleaning step in the 2nd cycle according to the present embodiment. The attached matter 60 on the sidewalls 1021b is removed.

Figure 8:
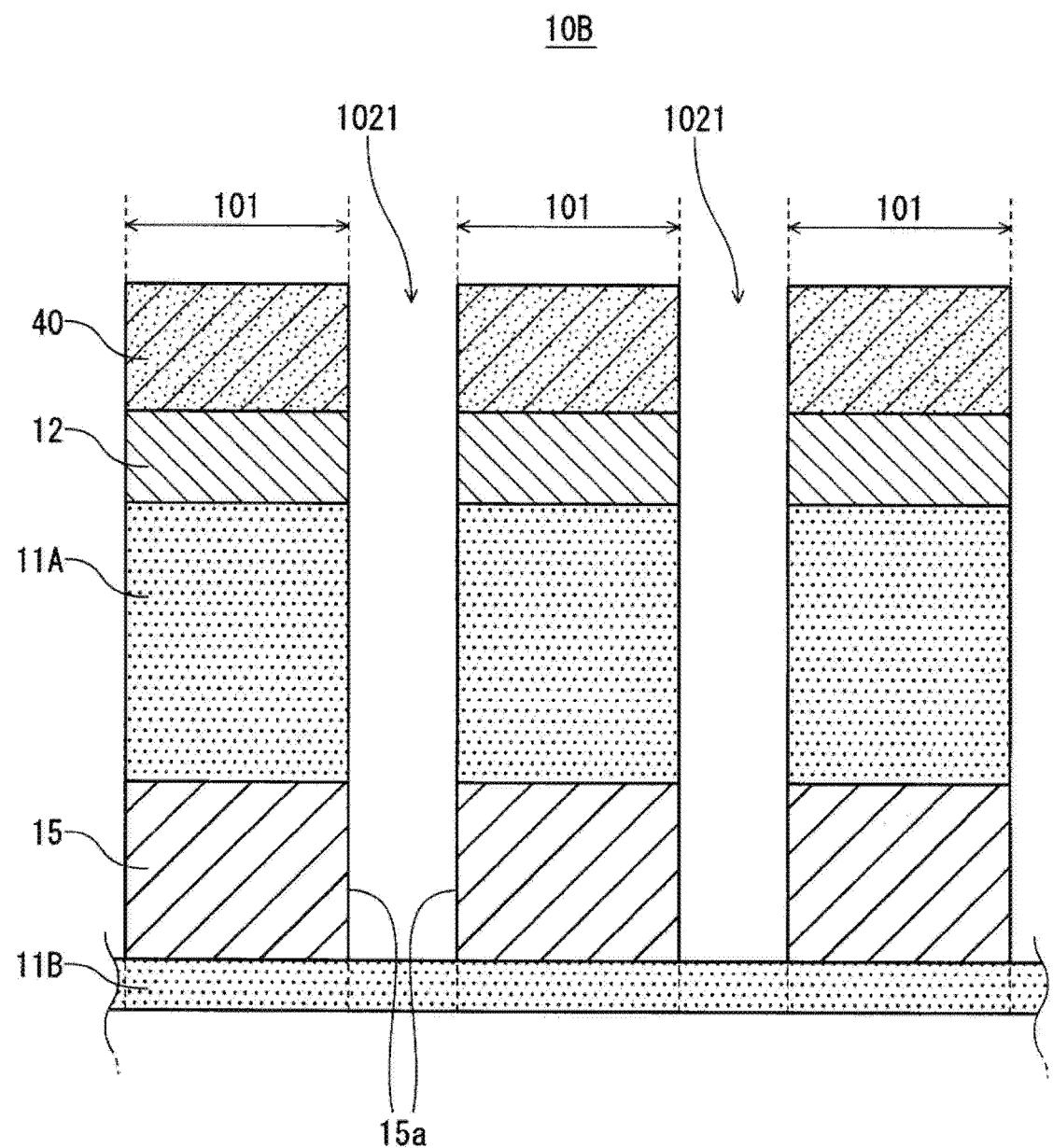
FIG. 8 is a schematic cross-sectional view showing an essential part of a substrate obtained by a plasma processing according to an embodiment of the present invention.

FIG. 8 is a schematic cross-sectional view showing an essential part of a substrate obtained by the plasma processing according to the present embodiment.

In the same manner as described above, subsequent cycles are repeated, to gradually etch the bottom 1021a of the trenches, while removing the attached matter 60 on the sidewalls 1021b. In this way, the oxide film 15 corresponding to the bottoms 1021a of the trenches is removed. The oxide film thus divided has side surfaces 15a which are substantially flush with the sidewalls of the first silicon layer 11A. The side surfaces 15a of the oxide film are substantially vertical.

In view of the ease of handling, the trenched substrate may be subjected to the oxide film removal process, while being held on a holding sheet secured to a frame. From the similar point of view, after forming trenches by the Bosch process in the laminate substrate held on the holding sheet secured to the frame, the resulting trenched substrate may be subjected as it is to the oxide film removal process. A member comprising a frame and a holding sheet secured to the frame is referred to as a conveying carrier.

(Conveying Carrier)

The frame is a frame member having an opening large enough to surround the trenched substrate or laminate substrate (hereinafter, sometimes simply referred to as the substrate). The frame has a predetermined width and a thickness which is substantially consistently thin. The frame has such a rigidity that it can be conveyed with the holding sheet and the substrate held thereon. The opening of the frame may be of any shape, for example, circular, rectangular, or polygonal, such as hexagonal. The frame may be made of any material, for example, a metal, such as aluminum or stainless steel, or a resin.

The holding sheet may be made of any material. For easy attachment of the substrate thereto, the holding sheet preferably includes an adhesive layer and a non-adhesive layer with flexibility.

The non-adhesive layer may be made of any material, and may be, for example, a thermoplastic resin, such as polyolefin (e.g., polyethylene, polypropylene), and polyester (e.g., polyvinyl chloride, polyethylene terephthalate). The resin film may include a rubber component for adding elasticity (e.g., ethylene-propylene rubber (EPM), ethylene-propylene-diene rubber (EPDM)), and various additives, such as a plasticizer, a softener, an antioxidant, and an electrically conductive material. The above thermoplastic resin may have a functional group that reacts during photopolymerization reaction, such as an acryl group. The non-adhesive layer may have any thickness; the thickness is, for example, 50 μm or more and 300 μm or less, preferably 50 μm or more and 150 μm or less.

The holding sheet is attached at its periphery to the frame, with the side where the adhesive layer is disposed (adhesive side) in contact with the frame, to cover an opening of the frame. On the adhesive side exposed from the opening of the frame, the substrate is attached, with one of its principal surfaces (second principal surface) in contact with the adhesive side. The substrate is thus held on the holding sheet. The substrate may be held on the holding sheet via a die attach film (DAF).

The adhesive layer is preferably made of an adhesive component, the adhesive strength of which is reduced by ultraviolet (UV) irradiation. In this case, when picking up element chips after plasma dicing, the element chips can be easily peeled off from the adhesive layer by UV irradiation, which eases the pickup. The adhesive layer can be obtained by, for example, applying a UV curing acrylic adhesive on one side of the non-adhesive layer, in a thickness of 5 µm or more and 100 µm or less (preferably 5 µm or more and 15 µm or less).

Figure 9A:
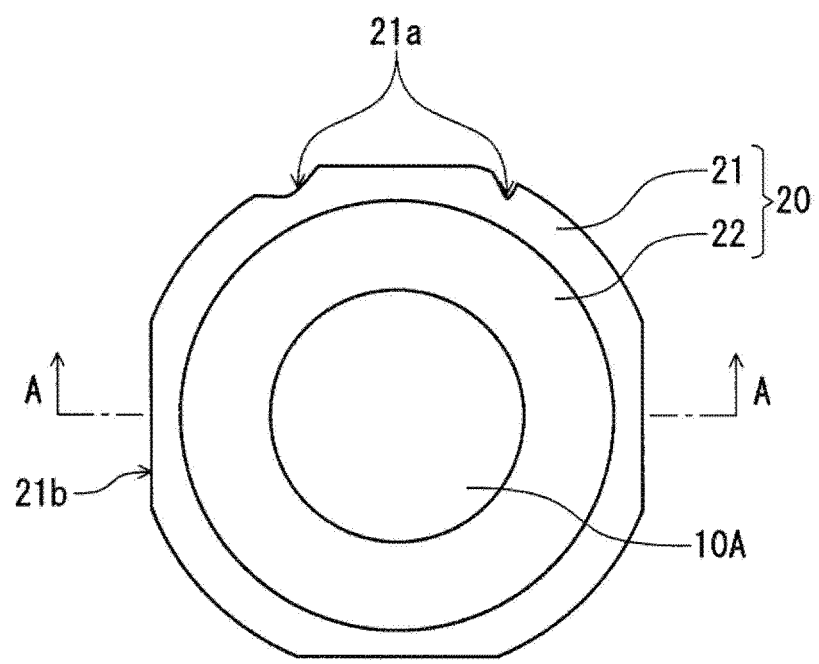
FIG. 9A is a schematic top view of a conveying carrier and a laminate substrate carried thereon used in an embodiment of the present invention.
Figure 9B:
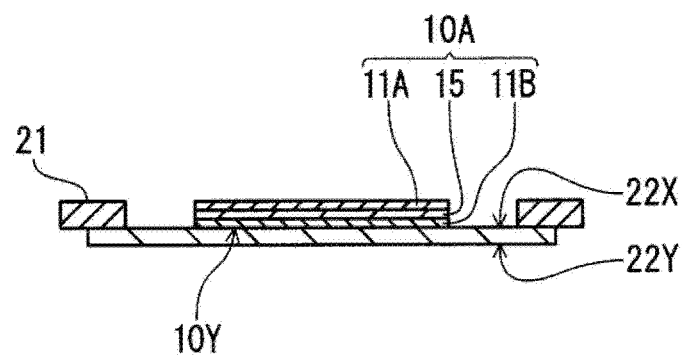
FIG. 9B is a cross-sectional view taken along a line A-A line of FIG. 9A.

FIG. 9A is a schematic top view of the laminate substrate prepared in the laminate substrate preparation process and the conveying carrier holding it. FIG. 9B is a cross-sectional view taken along a line A-A line of FIG. 9A.

A conveying carrier 20 includes a frame 21 and a holding sheet 22 secured to the frame 21. The frame 21 may be provided with a notch 21a and a corner cut 21b for correct positioning. The holding sheet 22 has an adhesive side 22X and a non-adhesive side 22Y, and the adhesive side 22X is attached at its periphery to one side of the frame 21. On a portion of the adhesive side 22X exposed from the frame 21, the second principal surface 10Y of the laminate substrate 10A is attached.

Figure 10:
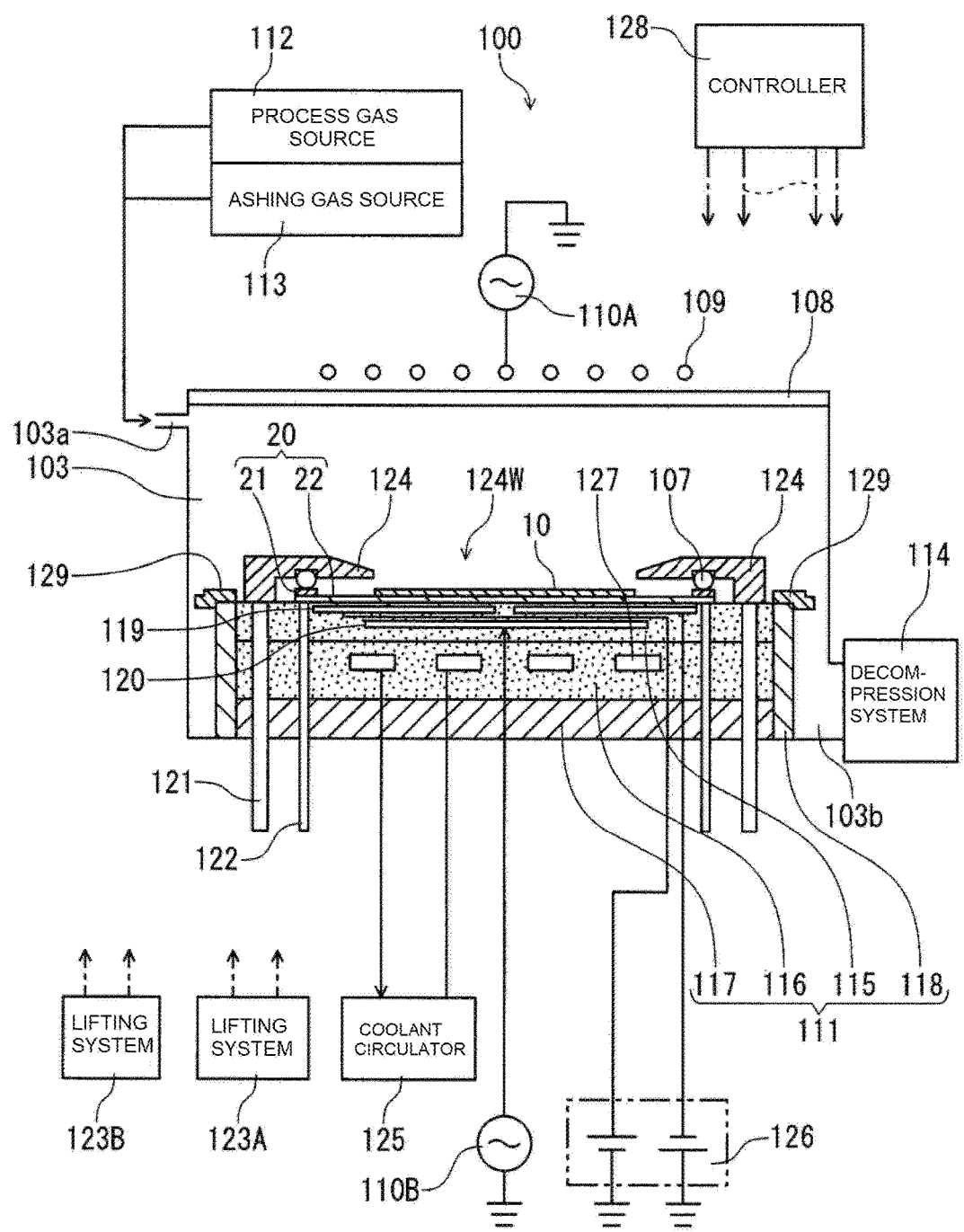
FIG. 10 is a schematic cross-sectional diagram of a plasma processing apparatus used in an embodiment of the present invention.

The Bosch process and the oxide film removal process as described above are performed using a plasma processing apparatus. Referring to FIG. 10, an example of the plasma processing apparatus will be specifically described below. The plasma processing apparatus, however, is not limited thereto. FIG. 10 is a schematic cross-sectional diagram of a plasma processing apparatus 100.

(Plasma Processing Apparatus)

The plasma processing apparatus 100 includes a stage 111. The conveying carrier 20 is set on the stage 111, with the substrate 10-holding surface of the holding sheet 22 faced upward. The stage 111 has such a size that the whole conveying carrier 20 can be seated thereon. Above the stage 111, a cover 124 having a window 124W for exposing at least one element chip 200 therefrom is arranged. The cover 124 is provided with pressure members 107 for pushing the frame 21 downward while the frame 21 is set on the stage 111. The pressure members 107 are preferably a member that can achieve point contact with the frame 21 (e.g., coil spring, elastic resin). This can correct a distortion of the frame 21, while restricting a thermal communication between the frame 21 and the cover 124.

The stage 111 and the cover 124 are arranged in a vacuum chamber 103. The vacuum chamber 103 is approximately cylindrical in shape, with the top open. The open top is closed by a dielectric member 108 serving as a lid. Examples of the constituent material of the vacuum chamber 103 include aluminum, stainless steel (SUS), and aluminum with anodic oxide coating. Examples of the constituent material of the dielectric member 108 include yttrium oxide ($Y_2O_3$), aluminum nitride (AlN), alumina ($Al_2O_3$), quartz ($SiO_2$), and other dielectric materials. Above the dielectric member 108, a first electrode 109 serving as an upper electrode is arranged. The first electrode 109 is electrically connected to a first high-frequency power source 110A. The stage 111 is arranged on the bottom side in the vacuum chamber 103.

The vacuum chamber 103 is provided with a gas inlet 103a and a gas outlet 103b. The gas inlet 103a is connected to plasma-generating gas (process gas) supply sources, i.e., a process gas source 112 and an ashing gas source 113, each through a conduit. The gas outlet 103b is connected to a decompression system 114 including a vacuum pump for exhausting gas from the vacuum chamber 103 to reduce the pressure therein. While the vacuum chamber 103 is supplied with a process gas, a high-frequency power is supplied to the first electrode 109 from the first high-frequency power source 110A. A plasma is thus generated in the vacuum chamber 103.

The stage 111 includes an electrode layer 115, a metal layer 116, and a base table 117 supporting the electrode layer 115 and the metal layer 116, each being approximately circular. The stage 111 further includes a peripheral member 118 surrounding the electrode layer 115, the metal layer 116, and the base table 117. The peripheral member 118 is formed of a metal having electrical conductivity and etching resistance, and serves to protect the electrode layer 115, the metal layer 116, and the base table 117 from plasma exposure. On the top surface of the peripheral member 118, an annular circumferential ring 129 is provided. The circumferential ring 129 serves to protect the top surface of the peripheral member 118 from plasma exposure. The electrode layer 115 and the circumferential ring 129 are formed of, for example, the dielectric material as mentioned above.

Within the electrode layer 115, an electrostatic chuck electrode (hereinafter, ESC electrode 119), and a second electrode 120 electrically connected to a second high-frequency power source 110B are disposed. The ESC electrode 119 is electrically connected to a DC power source 126. An electrostatic chuck system is composed of the ESC electrode 119 and the DC power source 126. The electrostatic chuck system pulls the holding sheet 22 onto the stage 111 and secures it thereto. Although a description will be given below of a case where the electrostatic chuck system is used as a fixing system for fixing the holding sheet 22 to the stage 111, this should not be taken as a limitation. A clamp (not shown) may be used for fixing the holding sheet 22 to the stage 111.

The metal layer 116 is formed of, for example, aluminum with anodic oxidation coating. The metal layer 116 contains a coolant channel 127 configured to cool the stage 111. As the stage 111 is cooled down, the holding sheet 22 set on the stage 111 is cooled down, and the cover 124 partially in contact with the stage 111 is also cooled down. This protects the substrate 10 and the holding sheet 22 from being damaged by being heated during plasma processing. A coolant in the coolant channel 127 is circulated by a coolant circulator 125.

The stage 111 is provided near its periphery with a plurality of supports 122 penetrating through the stage 111. The supports 122 support the frame 21 of the conveying carrier 20. The supports 122 are driven to move up and down by a first lifting system 123A. The conveying carrier 20 delivered into the vacuum chamber 103 is passed onto the supports 122 that have been raised to a predetermined position. Then the supports 122 are lowered until their top surfaces become flush with or below the top surface of the stage 111. The conveying carrier 20 is thus set at a predetermined position on the stage 111.

A plurality of lifting rods 121 are coupled to the cover 124 at its bottom end, so that the cover 124 can be lifted and lowered. The lifting rods 121 are driven to move up and down by the second lifting system 123B. The lifting and lowering operation of the cover 124 by the second lifting system 123B can be controlled independently from the operation by the first lifting system 123A.

Figure 11:
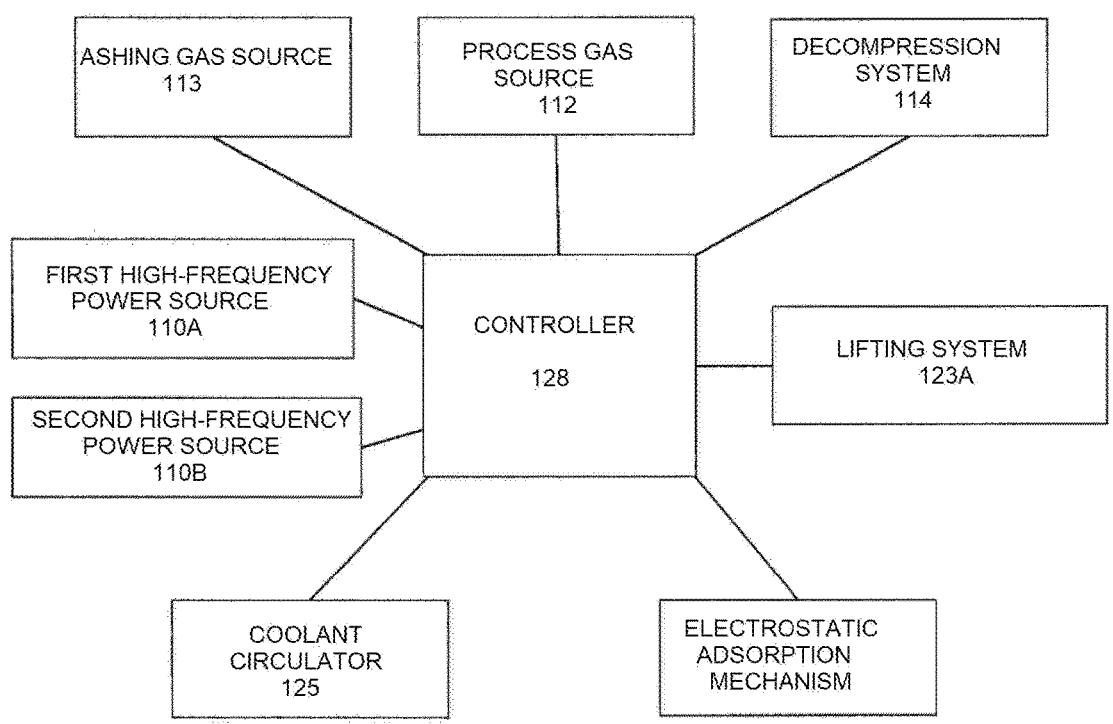
FIG. 11 is a block diagram of a plasma processing apparatus used in an embodiment of the present invention.

A controller 128 controls the operations of component elements of the plasma processing apparatus 100, the elements including the first and second high-frequency power sources 110A and 110B, the process gas source 112, the ashing gas source 113, the decompression system 114, the coolant circulator 125, the first and second lifting systems 123A and 123B, and the electrostatic chuck system. FIG. 11 is a block diagram of a plasma processing unit used in the present embodiment.

The plasma processing to the substrate 10 is carried out, after the conveying carrier 20 is delivered into the vacuum chamber 103 and the substrate 10 is seated on the stage 111.

Prior to the delivering of the substrate 10, within the vacuum chamber 103, the cover 124 is lifted to a predetermined position by means of the lifting rods 121. A gate valve (not shown) opens, and the conveying carrier 20 is delivered into the chamber. A plurality of the supports 122 are on standby at a raised position. When the conveying carrier 20 reaches a predetermined position above the stage 111, the conveying carrier 20 is passed onto the supports 122. The conveying carrier 20 is placed on the top surface of the supports 122, with the adhesive side 22X of the holding sheet 22 faced upward.

After the conveying carrier 20 is placed on the supports 122, the vacuum chamber 103 is hermetically closed. Next, the supports 122 start lowering. When the supports 122 are lowered until their top surfaces become flush with or below the top surface of the stage 111, the conveying carrier 20 is set on the stage 111. Then, the lifting rods 121 is driven to lower the cover 124 to a predetermined position. At this time, the distance between the cover 124 and the stage 111 is adjusted such that the pressure members 107 provided in the cover 124 come in point-contact with the frame 21. In this way, the frame 21 is pushed downward by the pressure members 107, and simultaneously, the frame 21 is covered with the cover 124, and the substrate 10 is exposed from the window 124W.

The cover 124 has, for example, a doughnut-like shape with approximately circular contour, and has a predetermined width and a thin thickness. The diameter of the window 124W is smaller than the inner diameter of the frame 21, and the outer diameter thereof is greater than the outer diameter of the frame 21. Therefore, when the cover 124 is lowered while the conveying carrier 20 is seated at a predetermined position on the stage 111, the cover 124 can cover the frame 21. From the window 124W, at least part of the substrate 10 is exposed.

The cover 124 is formed of, for example, a dielectric, such as ceramics (e.g., alumina, aluminum nitride) or quarts, or a metal, such as aluminum or aluminum with an anodic oxidation coating. The pressure members 107 can be formed of the aforementioned dielectric or metal, or a resin material.

After the conveying carrier 20 is passed onto the supports 122, a voltage is applied to the ESC electrode 119 from the DC power source 126. This brings the holding sheet 22 into contact with the stage 111 as well as to be electrostatically adsorbed onto the stage 111. The voltage application to the ESC electrode 119 may be initiated after the holding sheet 22 is set on (or in contact with) the stage 111.

When the plasma processing ends, the gas in the vacuum chamber 103 is evacuated, and the gate valve opens. The conveying carrier 20 is delivered out of the plasma processing apparatus 100 by means of a transfer system having entered through the gate valve. After the conveying carrier 20 is delivered out, the gate valve is immediately closed. The conveying carrier 20 may be delivered out by reversely performing the above-mentioned procedures of placing the conveying carrier 20 on the stage 111. Specifically, after the cover 124 is lifted to a predetermined position, the voltage supply to the ESC electrode 119 is cut off to release the conveying carrier 20 from the stage 111, and then the supports 122 are raised. After the supports 122 reach a predetermined raised position, the conveying carrier 20 is delivered out.

B. Element Chip Manufacturing Method

An element chip manufacturing method according to the present embodiment includes: a laminate substrate preparation process of preparing a laminate substrate having a first principal surface and a second principal surface and including a silicon layer containing silicon and an oxide film, the laminate substrate being segmented into a plurality of element regions and a plurality of dicing regions; a silicon layer removal process of exposing the laminate substrate to a plasma, to remove the silicon layer along the dicing regions until the oxide film is exposed on the first principal surface side, to form trenches; and an oxide film removal process of exposing the trenches to a plasma after the silicon layer removal process, to remove the oxide film exposed at the bottom of the trenches. The oxide film removal process includes a plurality of cycles, each cycle including: an oxide film etching step of etching the oxide film; and a cleaning step of removing an attached matter on inner walls of the trenches, after the oxide film etching step.

Figure 12:
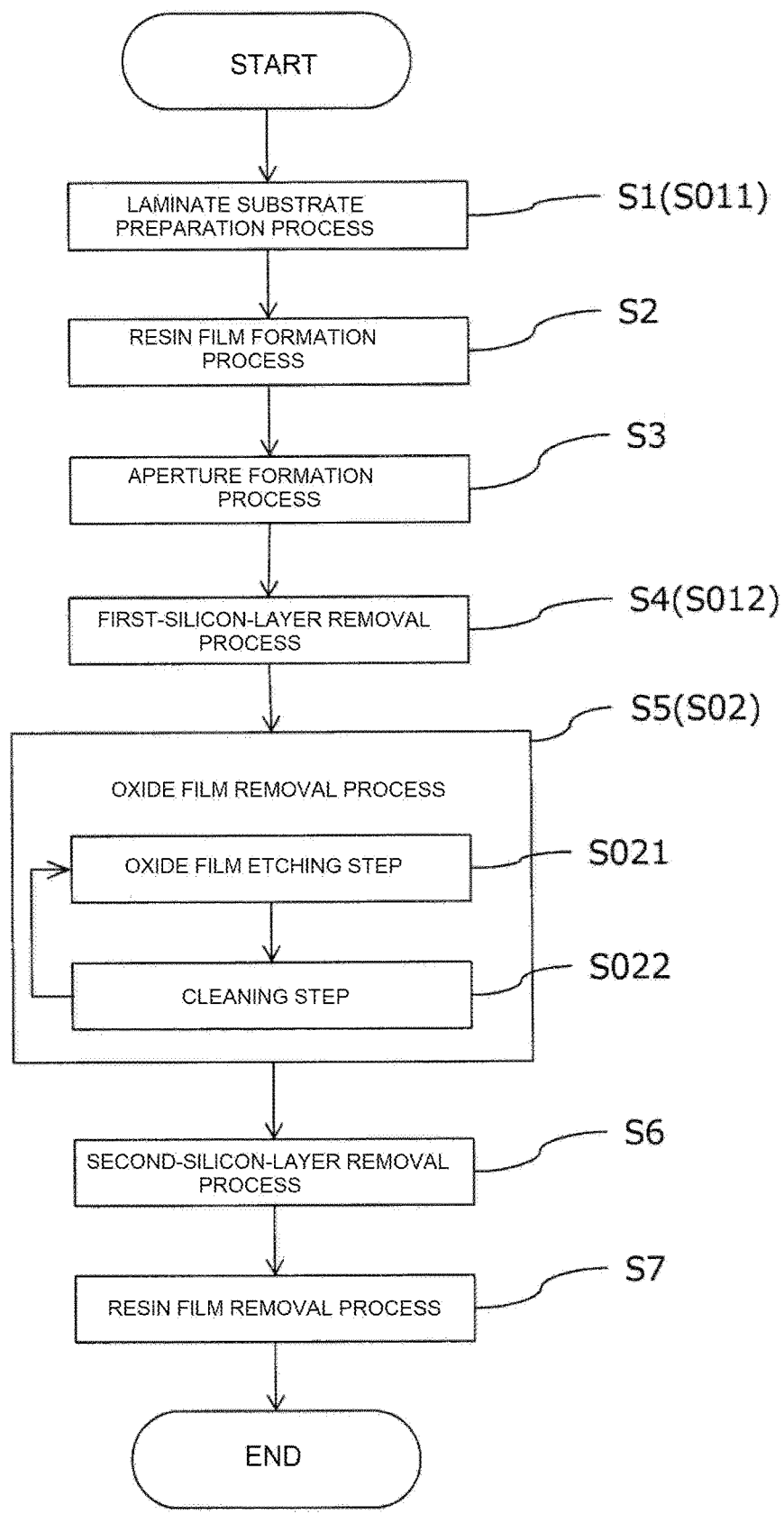
FIG. 12 is a flowchart of an element chip manufacturing method according to an embodiment of the present invention.

FIG. 12 is a flowchart of an element chip manufacturing method according to the present embodiment.

(1) Laminate Substrate Preparation Process (S1 (S011))

A laminate substrate as above having a first principal surface and a second principal surface and being segmented into a plurality of element regions and a plurality of dicing regions is prepared. The laminate substrate includes a silicon layer containing silicon (first silicon layer) and an oxide film disposed on the first silicon layer on the second principal surface side.

(2) Resin Film Formation Process (S2)

A resin film covering the first principal surface of the laminate substrate is formed. The resin film is provided for protecting the element regions of the laminate substrate from plasma exposure or the like.

The resin film contains, for example, a resist material, such as a thermosetting resin (e.g., polyimide), a photoresist (e.g., phenol resin), or a water-soluble resist (e.g., acrylic resin). The resin film can be formed by, for example, forming a resist material into a sheet and attaching the sheet to the substrate, or by applying a liquid raw material of a resist material to the substrate using spin-coating or spray-coating technique.

The resin film may have any thickness, but is preferably thick enough not to be completely removed in the plasma processing. The thickness of the resin film is set, for example, to be greater than a calculated amount (thickness) of the resin film to be etched in the plasma processing. The thickness of the resin film is, for example, 5 μm or more and 60 μm or less.

Figure 13:
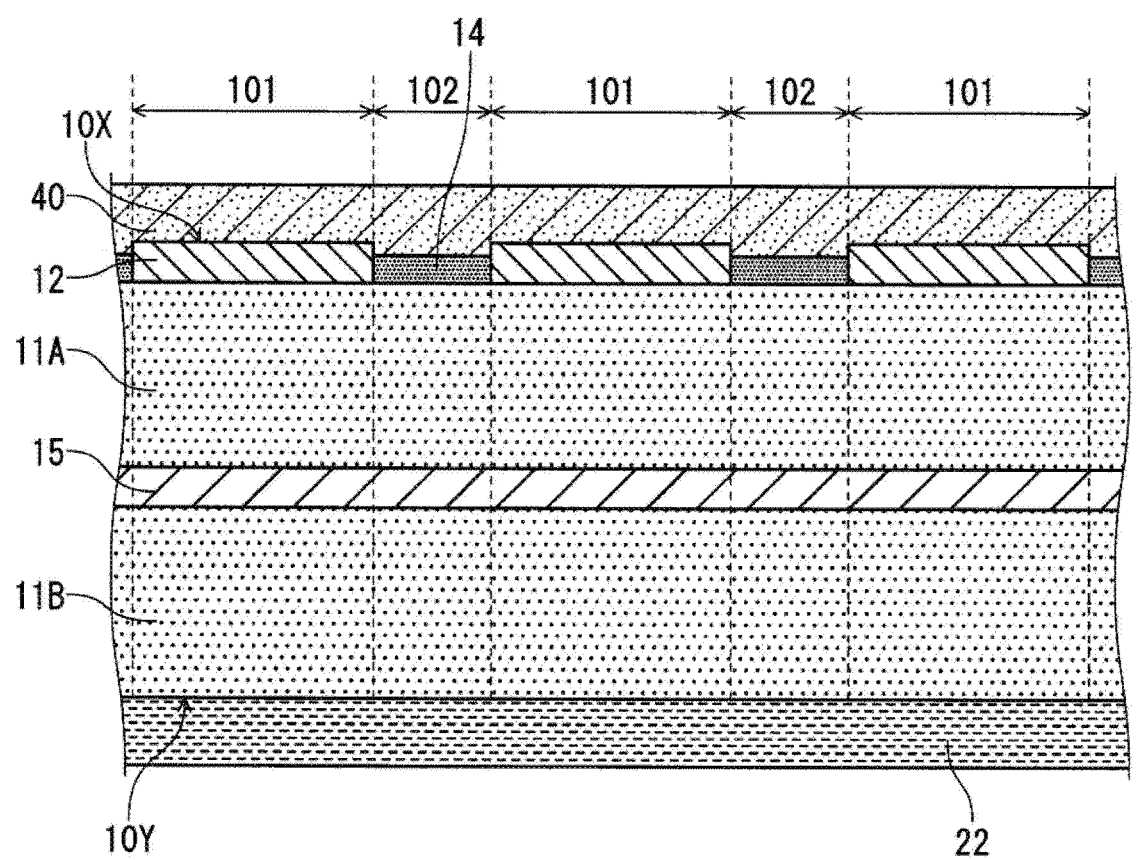
FIG. 13 is a schematic partial cross-sectional view of the laminate substrate after a resin film formation process according to an embodiment of the present invention.

FIG. 13 is a schematic partial cross-sectional view of the laminate substrate after the resin film formation process according to the present embodiment. The resin film 40 is formed on the first principal surface 10X of the laminate substrate 10A. Further, the second principal surface 10Y of the laminate substrate 10A is attached to the holding sheet 22. The laminate substrate 10A is thus held on the conveying carrier.

(3) Aperture Formation Process (S3)

Apertures are formed in the resin film, so that the laminate substrate is exposed along the dicing regions.

The apertures in the resin film formed of, for example, a photoresist can be formed by removing the resin film by photolithography along the dicing regions. In the resin film formed of a thermosetting resin or water-soluble resist, the apertures can be formed by removing the resin film by laser scribing along the dicing regions.

The apertures may be formed by removing the resin film and the electrically insulating film along the dicing regions. The removal of the insulating film along the dicing regions may be performed in a first-silicon-layer removal process as described later. In this case, the conditions for generating a plasma for removing the insulating film can be different from that for generating a plasma for etching the silicon layer or the oxide film.

Before performing the silicon etching process after the aperture formation process, the apertures may be irradiated with a laser beam or a plasma. This is for the purpose of, for example, reducing the residue produced by the aperture formation process. This enables to perform high-quality plasma etching.

Figure 14:
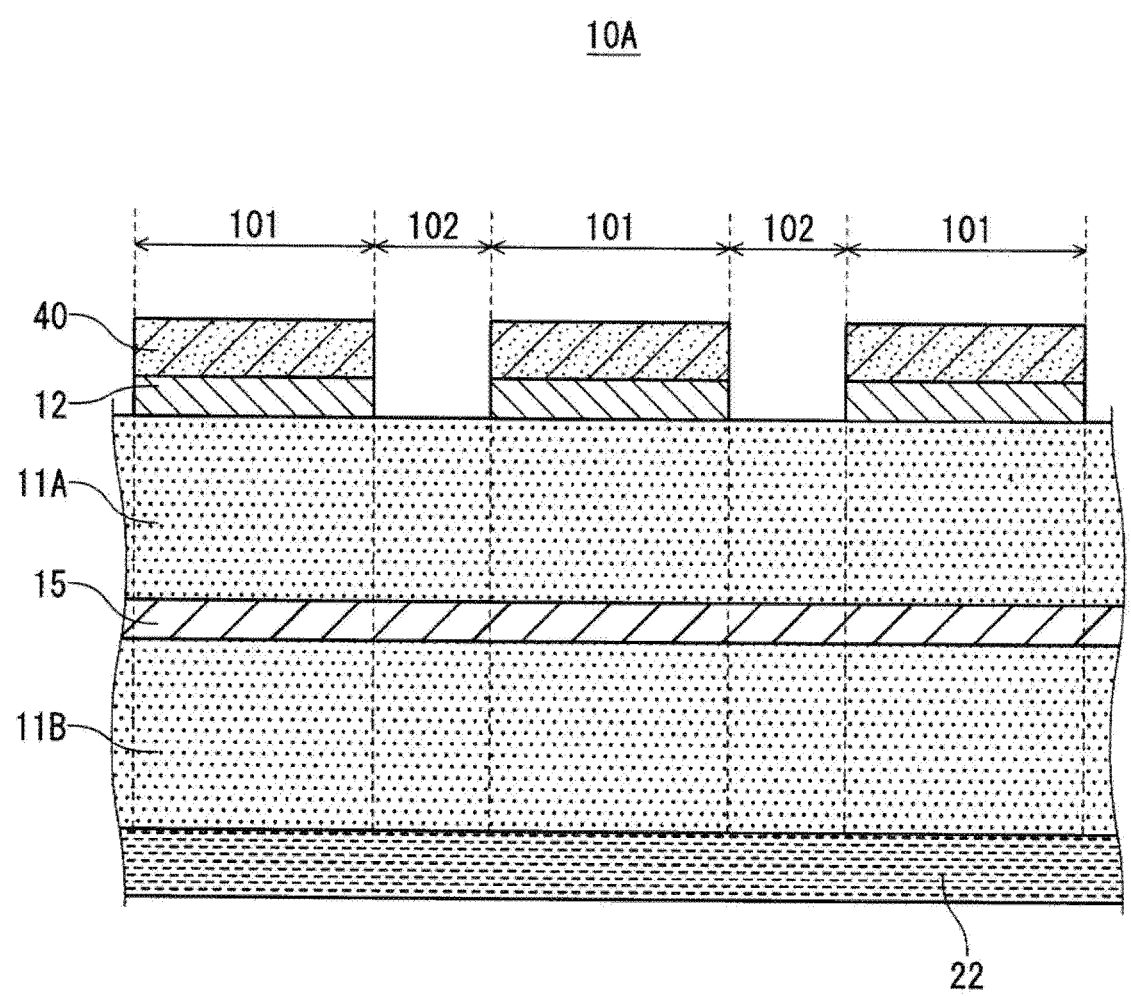
FIG. 14 is a schematic partial cross-sectional view of the laminate substrate after an aperture formation process according to an embodiment of the present invention.

FIG. 14 is a schematic partial cross-sectional view of the laminate substrate after the aperture formation process according to the present embodiment. The resin film 40 and the insulating film 14 are removed along the dicing regions 102 of the laminate substrate 10A, exposing the first silicon layer 11A from the apertures.

(4) First-Silicon-Layer Removal Process (S4 (S012))

The laminate substrate is exposed to a plasma, so that the first silicon layer exposed from the apertures is removed until the oxide film is exposed from the first principal surface side, to form a plurality of trenches.

The first-silicon-layer removal process is performed, for example, by the Bosch process described above. That is, a cycle is repeated a plurality of times, the cycle including: a silicon etching step of plasma-etching the first silicon layer along the dicing regions; and a protective film deposition step of exposing trenches formed by the silicon etching step to a plasma, to deposit a protective film on the inner walls of the trenches. The Bosch process allows for the formation of trenches with high aspect ratio.

The silicon etching step is carried out, for example, under the following conditions: while supplying $SF_6$ as a process gas at a rate of 200 sccm or more and 1000 sccm or less, the pressure in the vacuum chamber is controlled to 5 Pa or more and 15 Pa or less, with the input power to the first electrode from the first high-frequency power source set at 1500 W or more and 4800 W or less, and the input power to the second electrode from the second high-frequency power source set at 10 W or more and 500 W or less; and the processing time is 5 s or more and 20 s or less.

The protective film removal step is carried out, for example, under the following conditions: while supplying $SF_6$ as a process gas at a rate of 200 sccm or more and 1000 sccm or less, the pressure in the vacuum chamber is controlled to 5 Pa or more and 15 Pa or less, with the input power to the first electrode from the first high-frequency power source set at 1500 W or more and 4800 W or less, the input power to the second electrode from the second high-frequency power source set at 0 W or more and 1000 W or less; and the processing time is 2 s or more and 10 s or less.

The protective film deposition step is carried out, for example, under the following conditions: while supplying $C_4F_8$ as a process gas at a rate of 150 sccm or more and 1000 sccm or less, the pressure in the vacuum chamber is controlled to 10 Pa or more and 25 Pa or less, with the input power to the first electrode from the first high-frequency source set at 1500 W or more and 4800 W or less, and the input power to the second electrode from the second high-frequency power source set at 0 W or more and 50 W or less; and the processing time is 2 s or more and 15 s or less.

By repeating the protective film removal step, the silicon etching step, and the protective film deposition step under the conditions as above, the first silicon layer can be etched vertically in the depth direction at a rate of 10 μm/min or more and 20 μm/min or less.

Figure 15:
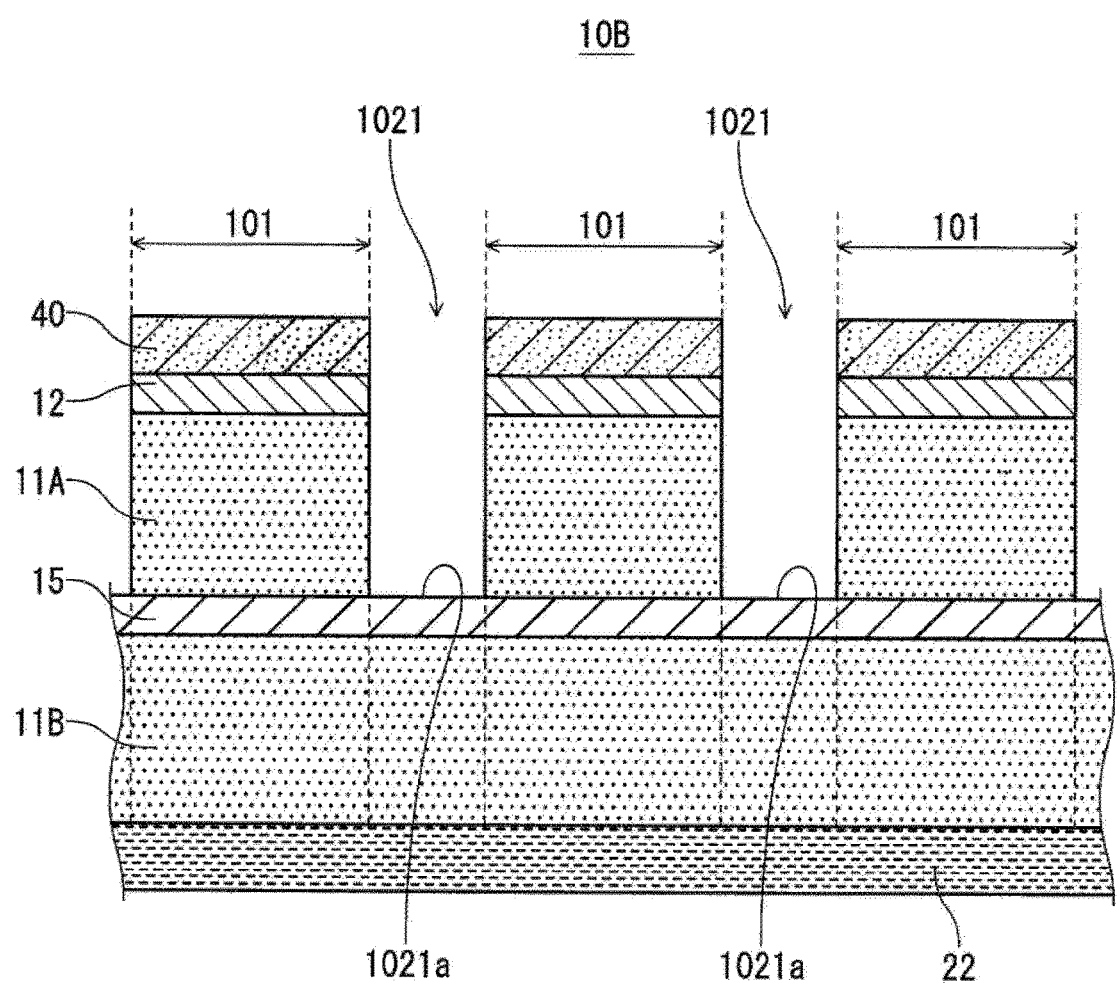
FIG. 15 is a schematic partial cross-sectional view of a trenched substrate obtained by a first-silicon-layer removal process according to an embodiment of the present invention.

FIG. 15 is a schematic partial cross-sectional view of a trenched substrate obtained by the first-silicon-layer removal process according to the present embodiment. The first silicon layer 11A is etched along the dicing regions, forming a plurality of the trenches 1021. The oxide film 15 is exposed at the bottom 1021a of the trenches.

(5) Oxide Film Removal Process (S5 (S02))

The oxide film is plasma-etched and removed.

The oxide film removal process is performed by the above-described plasma processing method. That is, a cycle is repeated a plurality of times, the cycle including: an oxide film etching step (S021) of etching the oxide film; and a cleaning step (S022) of removing an attached matter on the inner walls of the trenches, after the oxide film etching step. According to the above plasma processing method, the oxide film can be etched such that the divided oxide films have substantially vertical side surfaces.

Figure 16:
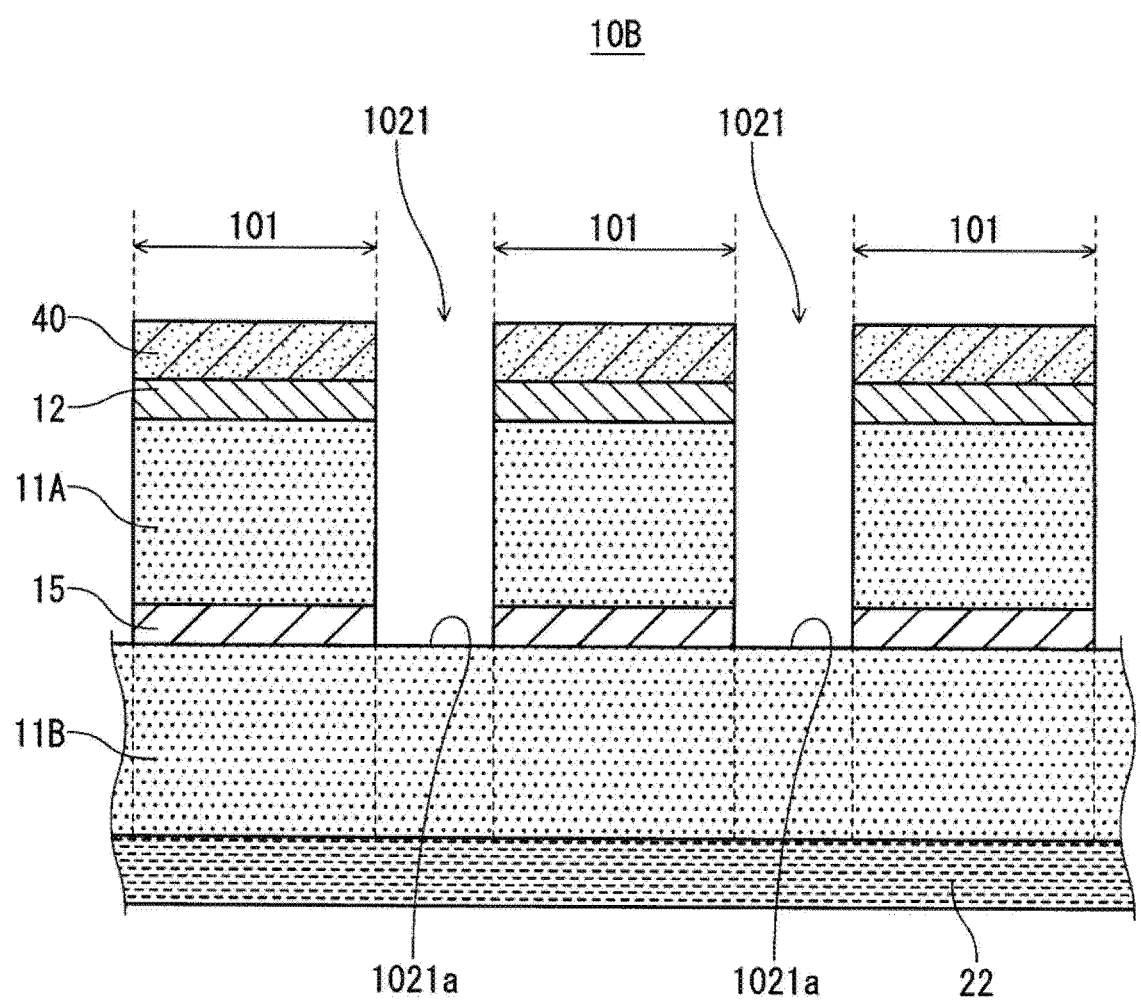
FIG. 16 is a schematic partial cross-sectional view of the trenched substrate after an oxide film removal process according to an embodiment of the present invention.

FIG. 16 is a schematic partial cross-sectional view of the trenched substrate after the oxide film removal process according to the present embodiment. The oxide film 15 is etched along the dicing regions, allowing the second silicon layer 11B to be exposed at the bottom 1021a of the trenches.

(6) Second-Silicon-Layer Removal Process (S6)

When the trenched substrate includes a second silicon layer, the trenched substrate is exposed again to a plasma, so that the second silicon layer is etched along the dicing regions. This divides the trenched substrate into a plurality of element chips.

The second-silicon-layer removal process is performed, for example, by the Bosch process as in the first-silicon-layer removal process. That is, a cycle is repeated a plurality of times, the cycle including: a silicon etching step of plasma-etching the second silicon layer along the dicing regions; and a protective film deposition step of depositing a protective film on the inner walls of the trenches formed by the silicon etching step. According to the method of the present embodiment, since the side surfaces of the divided oxide film are substantially vertical, the second silicon layer can also be etched with high verticality.

Figure 17:
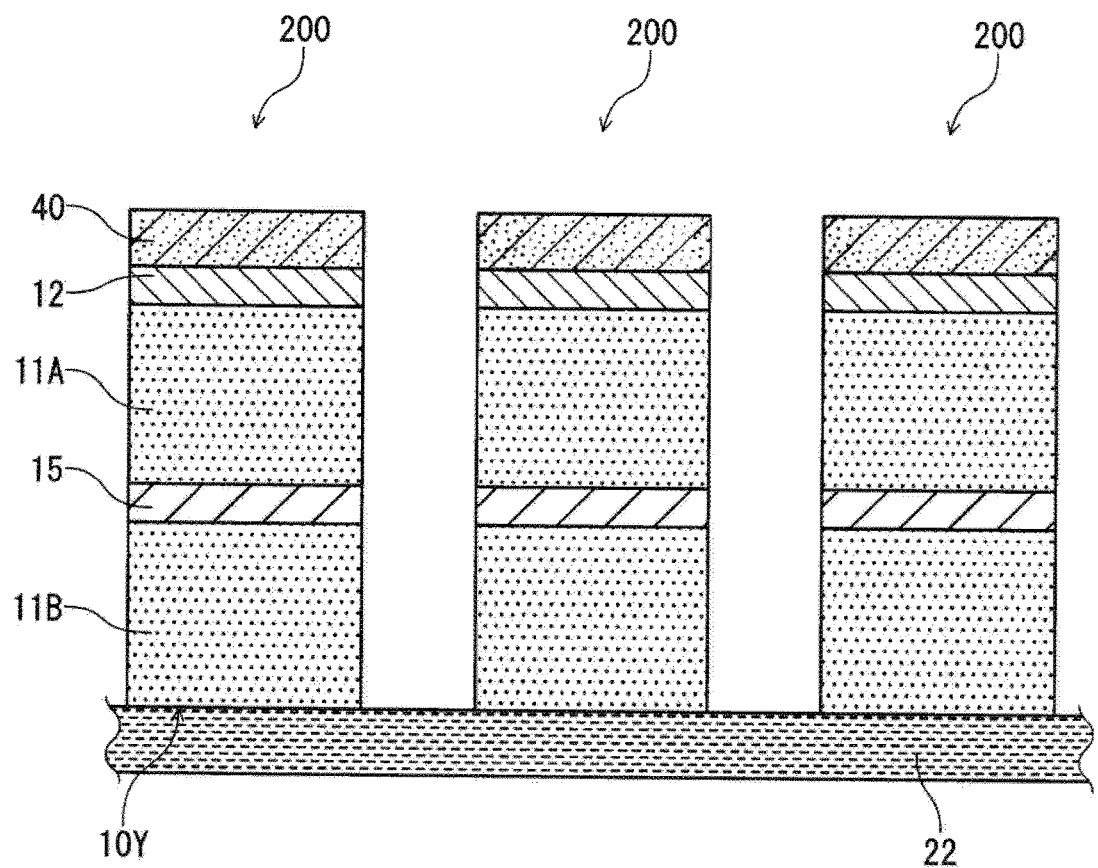
FIG. 17 is a schematic cross-sectional view of element chips obtained by a manufacturing method according to an embodiment of the present invention.

FIG. 17 is a schematic cross-sectional view of element chips obtained by the manufacturing method according to the present embodiment. The second silicon layer 11B is etched along the dicing regions, leaving a plurality of the element chips 200.

(7) Resin Film Removal Process (S7)

After the-second-silicon layer removal process, ashing may be performed in the plasma processing apparatus. This removes the resin film. An ashing process gas is, for example, oxygen gas, or a mixed gas of oxygen gas and fluorine-containing gas. The flow rate of the ashing process gas is, for example, 150 sccm or more 300 sccm or less.

After the second-silicon-layer removal process, the vacuum chamber is evacuated into a reduced-pressure atmosphere, and then, an ashing process is introduced into the vacuum chamber. Subsequently, a high-frequency power is supplied from the first high-frequency power source to the first electrode. This generates an ashing gas. The pressure in the vacuum chamber is, for example, 5 Pa or more and 15 Pa or less. The first electrode is applied with a high-frequency power of, for example, 1500 W or more and 5000 W or less. At this time, the second electrode may or may not be applied with a high-frequency power. The high-frequency power applied to the second electrode is preferably set to be lower than the power applied to the second electrode in the second-silicon layer removal process. The high-frequency power applied to the second electrode is, for example, 300 W or less.

When the resin film is water-soluble, the resin film may be removed by washing with water, instead of ashing.

Figure 18:
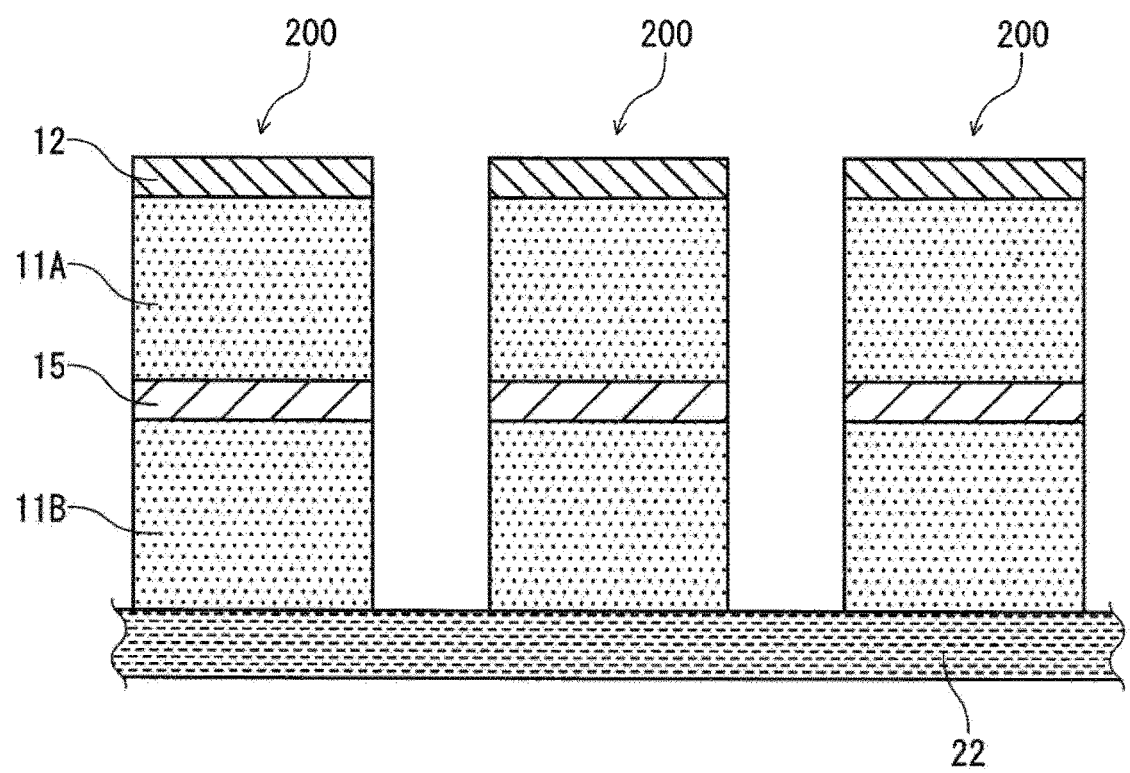
FIG. 18 is a schematic cross-sectional view of the element chips after a protective film removal process according to an embodiment of the present invention.

FIG. 18 is a schematic cross-sectional view of the element chips after the protective film removal process according to the present embodiment. The resin film 40 is removed from the element chips 200.

The present invention will be described more specifically below, with reference to Examples. It is noted, however, that the present invention is not limited to the following Examples.

Example 1 a) Laminate Substrate Preparation Process, Resin Film Formation Process, and Aperture Formation Process A laminate substrate including a silicon layer (thickness: about 50 µm) and an oxide film (thickness: about 10 µm) was prepared. A resin film (thickness: about 15 µm, Novolac resin) was formed by spin coating, so as to cover one of the principal surfaces of the silicon layer. A laser beam was irradiated to the dicing regions from the resin film side, to remove the resin film along the dicing regions.

b) Silicon Layer Removal Process

Subsequently, using the plasma processing apparatus of FIG. 10, the silicon layer was removed along the dicing regions by a Bosch process, to form a plurality of trenches. In the Bosch process, a cycle including a protective film deposition step, a protective film removal step, and a silicon etching step was repeated. The number of cycles repeated was 25.

In the protective film deposition step, $C_4F_8$ was used a process gas. The supply rate of $C_4F_8$ was 400 sccm. With the pressure in the vacuum chamber controlled at 15 Pa, the input power to the first electrode set at 4800 W, and the input power to the second electrode set at 50 W, the processing was performed for 3 s.

In the protective film removal process, $SF_6$ was used a process gas. The supply rate of $SF_6$ was 600 sccm. With the pressure in the vacuum chamber controlled at 20 Pa, the input power to the first electrode set at 4800 W, and the input power to the second electrode set at 200 W, the processing was performed for 2 s.

In the etching process, $SF_6$ was used a process gas. The supply rate of $SF_6$ was 600 sccm. With the pressure in the vacuum chamber controlled at 20 Pa, the input power to the first electrode set at 4800 W, and the input power to the second electrode set at 50 W, the processing was performed for 5 s.

c) Oxide Film Removal Process

The vacuum chamber of the same plasma processing apparatus was evacuated, in which an oxide film removal process was subsequently performed, to give a plurality of element chips. In the oxide film removal process, a cycle including below-described oxide film etching and cleaning steps was repeated. The number of cycles repeated was 20.

c-1) Oxide Film Etching Step

The trenched substrate was exposed to a first plasma, to etch the oxide film exposed at the bottom of the trenches. A mixed gas of Ar, $C_4F_8$, and $SF_6$ was used as an etching gas. The supply rates of Ar, $C_4F_8$, and $SF_6$ were 300 sccm, 20 sccm, and 25 sccm, respectively. With the pressure in the vacuum chamber controlled at 1 Pa, the input power to the first electrode set at 2400 W, and the input power to the second electrode set at 1300 W, the processing was performed for 5 min. Thereafter, the vacuum chamber was evacuated.

c-2) Cleaning Step

Subsequently, the trenched substrate was exposed to a second plasma, to remove an attached matter on the sidewalls. $O_2$ was used as a cleaning gas. The supply rate of O2 was 200 sccm. With the pressure in the vacuum chamber controlled at 20 Pa, the input power to the first electrode set at 3000 W, and the input power to the second electrode set at 50 W, the processing was performed for 1 min. Thereafter, the vacuum chamber was evacuated.

Figure 19:
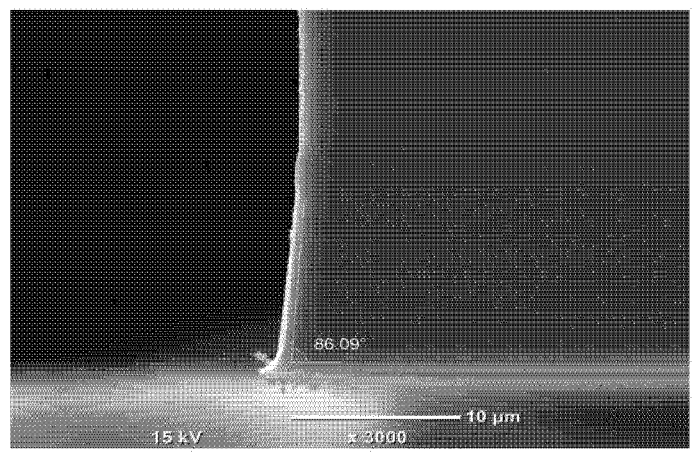
FIG. 19 is a SEM image (magnification: ×3000) of the cross section of an essential part of an element chip of Example 1.

FIG. 19 is a SEM image (magnification: ×3000) of the cross section of an essential part of the element chip thus obtained. The angle formed between the bottom surface (second principal surface) of the element chip and the side surface of the oxide film was about 86°.

Comparative Example 1

Element chips were produced in the same manner as in Example 1, except that the cleaning step was not performed.

Figure 20:
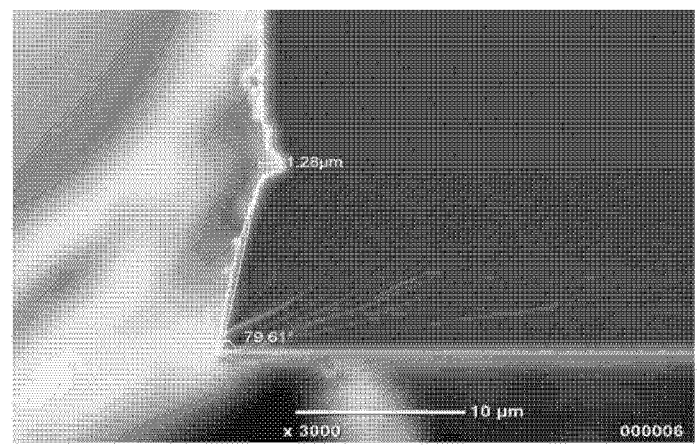
FIG. 20 is a SEM image (magnification: ×3000) of the cross section of an essential part of an element chip of Comparative Example 1.

FIG. 20 is a SEM image (magnification: ×3000) of the cross section of an essential part of the element chip thus obtained. The angle formed between the bottom surface (second principal surface) of the element chip and the side surface of the oxide film was about 80°.

According to the plasma processing method of the present invention, the verticality of the side surfaces of the oxide film can be improved. The method is therefore suitably applicable particularly when manufacturing element chips from a substrate including an oxide film and a silicon layer.

REFERENCE NUMERALS

| | |
|---|---|
| 10: | substrate |
| 10A: | laminate substrate |
| 10B: | Trenched substrate |
| 10X: | first principal surface |
| 10Y: | second principal surface |
| 101: | element region |
| 102: | dicing region |
| 1021: | trench |
| 1021a: | bottom |
| 1021b: | sidewall |
| 11A: | first silicon layer |
| 11B: | second silicon layer |
| 12: | wiring layer |
| 14: | insulating film |
| 15: | oxide film |
| 15a: | side surface |
| 20: | conveying carrier |
| 21: | frame |
| 21a: | notch |
| 21b: | corner cut |
| 22: | holding sheet |
| 22X: | adhesive side |
| 22Y: | non-adhesive side |
| 40: | resin film |
| 60: | attached matter |
| 100: | plasma processing apparatus |
| 103: | vacuum chamber |

-continued

| 103a: | gas inlet |
| 103b: | gas outlet |
| 108: | dielectric member (lid) |
| 109: | first electrode |
| 110A: | first high-frequency power source |
| 110B: | second high-frequency power source |
| 111: | stage |
| 112: | process gas source |
| 113: | ashing gas source |
| 114: | decompression system |
| 115: | electrode layer |
| 116: | metal layer |
| 117: | base table |
| 118: | peripheral member |
| 119: | ESC electrode |
| 120: | second electrode |
| 121: | lifting rod |
| 122: | support |
| 123: | lifting system |
| 125: | coolant circulator |
| 126: | DC power source |
| 127: | coolant channel |
| 128: | controller |
| 129: | circumferential ring |
| 200: | element chip |

What is claimed is:

1. A plasma processing method, comprising:
a trenched substrate preparation process of preparing a trenched substrate having trenches having a bottom exposing an oxide film; and
an oxide film removal process of exposing the trenched substrate to a plasma, to remove the oxide film,
the oxide film removal process including a plurality of cycles, each cycle including:
an oxide film etching step of etching the oxide film; and
a cleaning step of removing an attached matter on inner walls of the trenches, after the oxide film etching step,
wherein
the trenched substrate preparation process includes:
a laminate substrate preparation process of preparing a laminate substrate having a first principal surface and a second principal surface opposite to the first principal surface, the laminate substrate including a silicon layer containing silicon and the oxide film disposed on the silicon layer on the second principal surface side, the laminate substrate being segmented into a plurality of element regions and a plurality of dicing regions; and
a silicon layer removal process of removing the silicon layer along the dicing regions until the oxide film is exposed on the first principal surface side, to form the trenches.

2. The plasma processing method according to claim 1, wherein
the silicon layer removal process includes a plurality of cycles, each cycle including:
a silicon etching step of plasma-etching the silicon layer along the dicing regions; and
a protective film deposition step of exposing trenches formed by the silicon etching step to a plasma, to deposit a protective film on inner walls of the trenches.

3. The plasma processing method according to claim 1, wherein the trenched substrate in the oxide film removal process has a higher temperature than the laminate substrate in the silicon layer removal process.

4. The plasma processing method according to claim 1, wherein
the oxide film etching step is performed with a first plasma generated from a gas containing carbon atoms, and
the cleaning step is performed with a second plasma generated from a gas containing oxygen gas.

5. The plasma processing method according to claim 1, wherein the silicon layer removal process and the oxide film removal process are performed in a vacuum chamber of a same plasma processing apparatus.

6. An element chip manufacturing method, comprising:
a laminate substrate preparation process of preparing a laminate substrate having a first principal surface and a second principal surface opposite to the first principal surface, the laminate substrate including a silicon layer containing silicon and an oxide film disposed on the silicon layer on the second principal surface side, the laminate substrate being segmented into a plurality of element regions and a plurality of dicing regions;
a silicon layer removal process of exposing the laminate substrate to a plasma, to remove the silicon layer along the dicing regions until the oxide film is exposed on the first principal surface side, to form trenches; and
an oxide film removal process of exposing the trenches to a plasma, after the silicon layer removal process, to remove the oxide film exposed at a bottom of the trenches,
the oxide film removal process including a plurality of cycles, each cycle including:
an oxide film etching step of etching the oxide film; and
a cleaning step of removing an attached matter on inner walls of the trenches, after the oxide film etching step.

7. The element chip manufacturing method according to claim 6,
wherein the silicon layer removal process and the oxide film removal process are performed in a vacuum chamber of a same plasma processing apparatus.

* * * * *